(12) United States Patent
Chida et al.

(10) Patent No.: US 10,522,574 B2
(45) Date of Patent: Dec. 31, 2019

(54) MANUFACTURING METHOD OF DISPLAY DEVICE AND MANUFACTURING METHOD OF ELECTRONIC DEVICE

(71) Applicant: Semiconductor Energy Laboratory Co., Ltd., Atsugi-shi, Kanagawa-ken (JP)

(72) Inventors: Akihiro Chida, Kanagawa (JP);
Tatsuya Sakuishi, Kanagawa (JP);
Daiki Nakamura, Kanagawa (JP);
Tomoya Aoyama, Kanagawa (JP);
Kohei Yokoyama, Kanagawa (JP);
Daisuke Kubota, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 86 days.

(21) Appl. No.: 15/591,156

(22) Filed: May 10, 2017

(65) Prior Publication Data
US 2017/0330903 A1  Nov. 16, 2017

(30) Foreign Application Priority Data
May 16, 2016 (JP) ................. 2016-097631

(51) Int. Cl.
*H01L 27/12* (2006.01)
*H01L 27/32* (2006.01)
(Continued)

(52) U.S. Cl.
CPC ........ *H01L 27/1266* (2013.01); *H01L 27/124* (2013.01); *H01L 27/3262* (2013.01);
(Continued)

(58) Field of Classification Search
CPC ............. H01L 27/1266; H01L 51/0021; H01L 27/124; H01L 27/3276; H01L 27/3262;
(Continued)

(56) References Cited

U.S. PATENT DOCUMENTS

| 8,367,440 B2 | 2/2013 | Takayama et al. |
| 8,415,208 B2 | 4/2013 | Takayama et al. |

(Continued)

FOREIGN PATENT DOCUMENTS

JP  2003-174153 A  6/2003

*Primary Examiner* — Latanya N Crawford
(74) *Attorney, Agent, or Firm* — Fish & Richardson P.C.

(57) ABSTRACT

A method for manufacturing a display device is provided. The method includes a step of forming a first layer over a first substrate, a terminal electrode over the first layer, a display element over the first layer, and a peeling layer overlapping with the terminal electrode, a step of forming a second layer over a second substrate, a step of attaching the first substrate to the second substrate with a bonding layer therebetween, a step of separating the first substrate from the first layer, a step of attaching a third substrate to the first layer, a step of separating the second substrate from the second layer together with part of the bonding layer, and a step of attaching a fourth substrate to the second layer. At least one of the first layer and the second layer includes an organic film.

20 Claims, 25 Drawing Sheets

(51) Int. Cl.
    *H01L 51/00*    (2006.01)
    *H01L 29/786*    (2006.01)

(52) U.S. Cl.
    CPC ...... *H01L 27/3276* (2013.01); *H01L 51/0021* (2013.01); *H01L 29/7869* (2013.01); *H01L 29/78648* (2013.01); *H01L 51/003* (2013.01); *H01L 2227/323* (2013.01); *H01L 2251/5338* (2013.01)

(58) Field of Classification Search
    CPC ............ H01L 2251/5338; H01L 51/003; H01L 29/7869; H01L 29/78648; H01L 2227/323
    See application file for complete search history.

(56) References Cited

U.S. PATENT DOCUMENTS

| | | | |
|---|---|---|---|
| 9,887,392 B2* | 2/2018 | Sakuishi | ............. H01L 27/1266 |
| 2003/0032210 A1 | 2/2003 | Takayama et al. | |
| 2003/0034497 A1 | 2/2003 | Yamazaki et al. | |
| 2003/0064569 A1 | 4/2003 | Takayama et al. | |
| 2003/0082889 A1* | 5/2003 | Maruyama | .......... H01L 27/1214 438/455 |
| 2007/0212853 A1* | 9/2007 | Maruyama | .......... H01L 27/1214 438/458 |
| 2008/0048562 A1 | 2/2008 | Matsuda | |
| 2009/0108728 A1 | 4/2009 | Ushimaru et al. | |
| 2009/0114915 A1 | 5/2009 | Toriumi | |
| 2010/0117072 A1 | 5/2010 | Ofuji et al. | |
| 2011/0316013 A1 | 12/2011 | Boerner | |
| 2013/0214324 A1 | 8/2013 | Takayama et al. | |
| 2013/0240855 A1* | 9/2013 | Chida | ................. H01L 51/5237 257/40 |
| 2014/0065430 A1 | 3/2014 | Yamazaki et al. | |
| 2014/0273317 A1 | 9/2014 | Chida | |
| 2015/0155505 A1 | 6/2015 | Yamazaki et al. | |
| 2015/0233557 A1 | 8/2015 | Aoyama et al. | |
| 2015/0250038 A1 | 9/2015 | Sakuishi et al. | |
| 2015/0263314 A1 | 9/2015 | Sakuishi et al. | |
| 2017/0077428 A1 | 3/2017 | Sakuishi et al. | |

* cited by examiner

FIG. 19A1
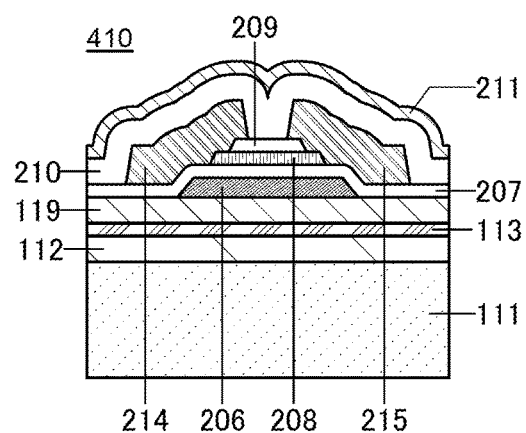
FIG. 19A2
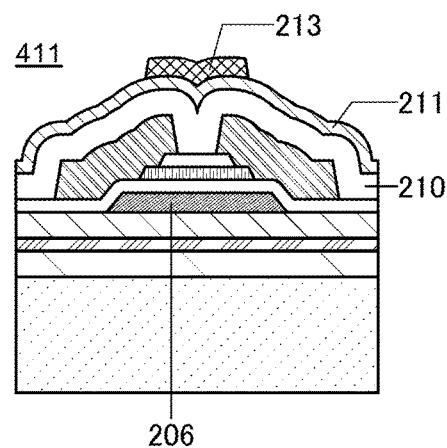
FIG. 19B1
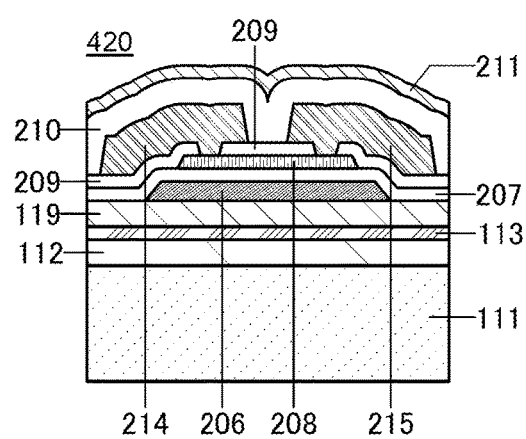
FIG. 19B2
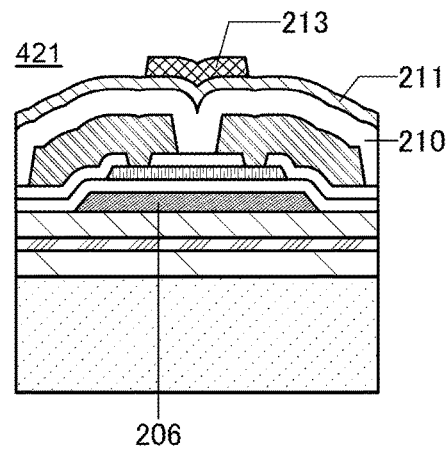

FIG. 20A1
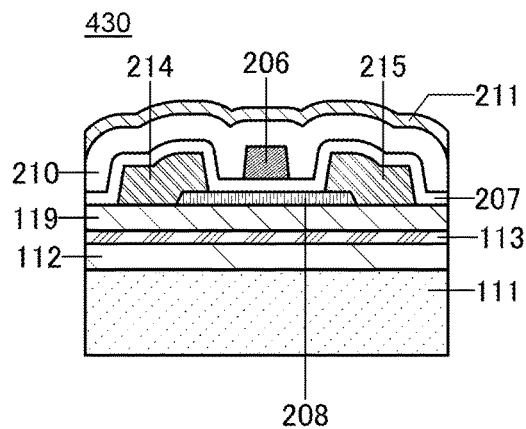
FIG. 20A2
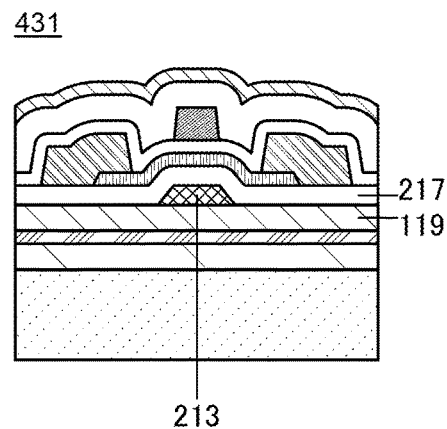
FIG. 20A3
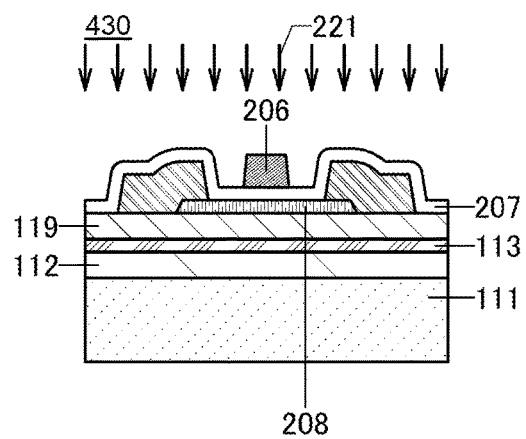
FIG. 20B1
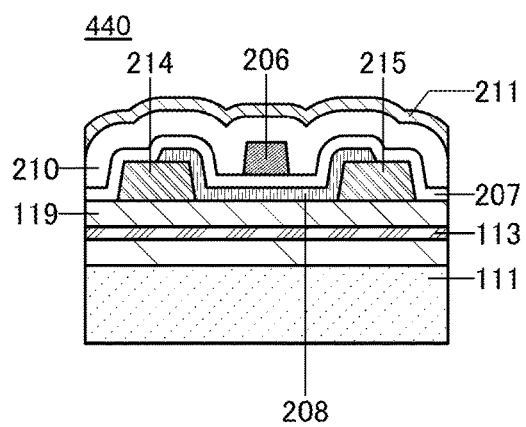
FIG. 20B2
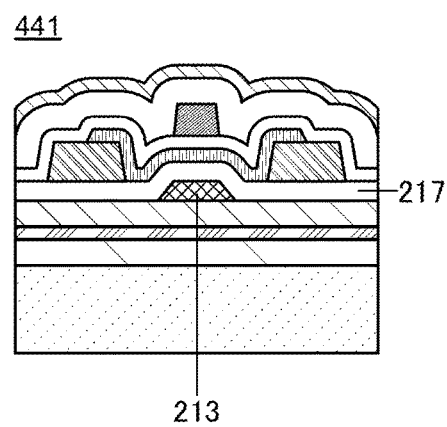

MANUFACTURING METHOD OF DISPLAY DEVICE AND MANUFACTURING METHOD OF ELECTRONIC DEVICE

BACKGROUND OF THE INVENTION

1. Field of the Invention

The present invention relates to a manufacturing method of a display device and a manufacturing method of an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In recent years, research and development have been extensively conducted on liquid crystal elements as a display element used in a display region of a display device. Research and development have also been extensively conducted on light-emitting elements utilizing electroluminescence (EL). As a basic structure of a light-emitting element, a layer containing a light-emitting substance is provided between a pair of electrodes. Voltage is applied to this light-emitting element to obtain light emission from the light-emitting substance.

The light-emitting element is a self-luminous element; thus, a display device using the light-emitting elements has, in particular, advantages such as high visibility, no necessity of a backlight, and low power consumption. The display device using the light-emitting elements also has advantages in that it can be manufactured to be thin and lightweight and has high response speed.

A display device including the light-emitting elements can have flexibility; therefore, the use of a flexible substrate for the display device has been proposed.

As a method for manufacturing a display device using a flexible substrate, a technique has been developed in which an oxide layer and a metal layer are formed between a substrate and a semiconductor element, the semiconductor element is separated from the substrate by utilizing weak adhesion at an interface between the oxide layer and the metal layer, and then the semiconductor element is transferred to another substrate (e.g., a flexible substrate) (Patent Document 1).

In some cases, over a light-emitting element that has been formed over a flexible substrate, another flexible substrate is provided in order to protect a surface of the light-emitting element or prevent entry of moisture or impurities from the outside.

REFERENCE

Patent Document

[Patent Document 1] Japanese Published Patent Application No. 2003-174153

SUMMARY OF THE INVENTION

In order to supply a signal or electric power to a display device using a flexible substrate, it is necessary that part of the flexible substrate be removed by laser light or with an edged tool to expose an electrode so that an external electrode such as a flexible printed circuit (FPC) is connected to the electrode.

However, a method in which part of a flexible substrate is removed by laser light or with an edged tool has a problem in that an electrode included in a display device is damaged easily and the reliability and manufacturing yield of the display device are reduced easily. In addition, a display region and an electrode need to be provided with a sufficient space therebetween in order to prevent damage to the display region due to the above-described method; for this reason, signal attenuation or electric power attenuation due to an increase in wiring resistance is caused easily.

An object of one embodiment of the present invention is to provide a method for manufacturing a display device that does not easily damage an electrode. Another object of one embodiment of the present invention is to provide a method for manufacturing a display device that does not easily damage a display region. Another object of one embodiment of the present invention is to provide a highly reliable display device and a method for manufacturing the same. Another object of one embodiment of the present invention is to provide a display device, electronic device, or the like having high visibility. Another object of one embodiment of the present invention is to provide a display device, electronic device, or the like having high display quality. Another object of one embodiment of the present invention is to provide a display device, electronic device, or the like having high reliability. Another object of one embodiment of the present invention is to provide a display device, electronic device, or the like that is unlikely to be broken. Another object of one embodiment of the present invention is to provide a display device, electronic device, or the like with low power consumption. Another object of one embodiment of the present invention is to provide a novel display device, electronic device, or the like.

Note that the description of these objects does not preclude the existence of other objects. In one embodiment of the present invention, there is no need to achieve all the objects. Other objects will be apparent from and can be derived from the description of the specification, the drawings, the claims, and the like.

(1)

One embodiment of the present invention is a method for manufacturing a display device including a display region, which includes a first step, a second step, a third step, a fourth step, a fifth step, a sixth step, and a seventh step. The first step includes providing a first layer over a first surface of a first substrate, providing an electrode over the first layer, providing a first insulating layer over the electrode and the first layer, providing a first opening in a region overlapping with the electrode by removing part of the first insulating layer, providing a display element over the first insulating layer, and providing a second layer over the first insulating layer and over the electrode in the first opening. The second step includes providing a third layer over a second surface of a second substrate, and providing a second opening by removing part of the third layer. The third step includes attaching the first substrate to the second substrate with a bonding layer provided therebetween such that the first surface and the second surface face each other and the first opening and the second opening overlap with each other. The fourth step includes peeling the first substrate off from the first layer. The fifth step includes attaching a third substrate to the first layer. The sixth step includes peeling the second substrate off from the third layer. The seventh step includes attaching a fourth substrate to the third layer. In the third step, the bonding layer includes a first region where the bonding layer and the second opening overlap with each other, and the second layer includes a second region where the second layer and the second opening overlap with each other. In the sixth step, at least part of the bonding layer in the first region and at least part of the second layer in the second region are peeled together with the second substrate to expose at least part of the electrode. The first layer includes a first organic film. The third layer includes a second organic film.

(2)

Another embodiment of the present invention is the method for manufacturing a display device according to (1) above, in which the first layer includes a second insulating layer over the first organic film.

(3)

Another embodiment of the present invention is the method for manufacturing a display device according to (1) or (2) above, in which the third layer includes a third insulating layer over the second organic film.

(4)

Another embodiment of the present invention is the method for manufacturing a display device according to any one of (1) to (3) above, in which the first organic film and/or the second organic film is formed by performing at least one of light irradiation treatment and heat treatment, with the use of an organic material having at least one of photosensitivity and a thermosetting property.

(5)

Another embodiment of the present invention is the method for manufacturing a display device according to any one of (1) to (4) above, in which the first substrate is peeled off from the first layer by irradiating the first layer with light using a laser in the fourth step, and the second substrate is peeled off from the third layer by irradiating the third layer with light using a laser in the sixth step.

(6)

Another embodiment of the present invention is the method for manufacturing a display device according to any one of (1) to (5) above, in which the second layer is a stacked layer including an EL layer and a conductive layer.

(7)

Another embodiment of the present invention is the method for manufacturing a display device according to any one of (1) to (6) above, in which the first substrate includes a glass substrate, a quartz substrate, a sapphire substrate, a ceramic substrate, a metal substrate, a semiconductor substrate, or a plastic substrate, and the second substrate includes a glass substrate, a quartz substrate, a sapphire substrate, a ceramic substrate, a metal substrate, a semiconductor substrate, or a plastic substrate.

(8)

Another embodiment of the present invention is the method for manufacturing a display device according to any one of (1) to (7) above, in which the third substrate and the fourth substrate have flexibility.

(9)

Another embodiment of the present invention is the method for manufacturing a display device according to any one of (1) to (8) above, in which the display element is a light-emitting element.

(10)

Another embodiment of the present invention is the method for manufacturing an electronic device including a display device, in which the electronic device includes a battery, a touch sensor, or a housing, and the display device is manufactured by the method for manufacturing a display device described in any one of (1) to (9) above.

One embodiment of the present invention can provide a method for manufacturing a display device that does not easily damage an electrode. One embodiment of the present invention can provide a method for manufacturing a display device that does not easily damage a display region. One embodiment of the present invention can provide a highly reliable display device and a method for manufacturing the same.

One embodiment of the present invention can provide a display device, electronic device, or the like having high visibility. One embodiment of the present invention can provide a display device, electronic device, or the like having high display quality. One embodiment of the present invention can provide a display device, electronic device, or the like having high reliability. One embodiment of the present invention can provide a display device, electronic device, or the like that is unlikely to be broken. One embodiment of the present invention can provide a display device, electronic device, or the like with low power consumption. One embodiment of the present invention can provide a novel display device, electronic device, or the like.

Note that the description of these effects does not preclude the existence of other effects. One embodiment of the present invention does not need to have all the effects listed above. Other effects will be apparent from and can be derived from the description of the specification, the drawings, the claims, and the like.

BRIEF DESCRIPTION OF THE DRAWINGS

In the accompanying drawings:

FIGS. 19A1, 19A2, 19B1, and 19B2 are each a cross-sectional view illustrating one embodiment of a transistor;

FIGS. 20A1, 20A2, 20A3, 20B1, and 20B2 are each a cross-sectional view illustrating one embodiment of a transistor;

DETAILED DESCRIPTION OF THE INVENTION

Embodiment 1

Figure 1A:
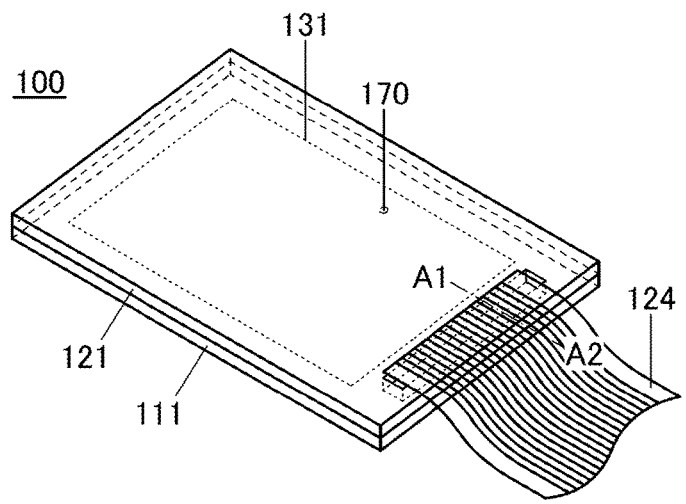
FIGS. 1A and 1B are a perspective view and a cross-sectional view illustrating one embodiment of a display device.
Figure 1B:
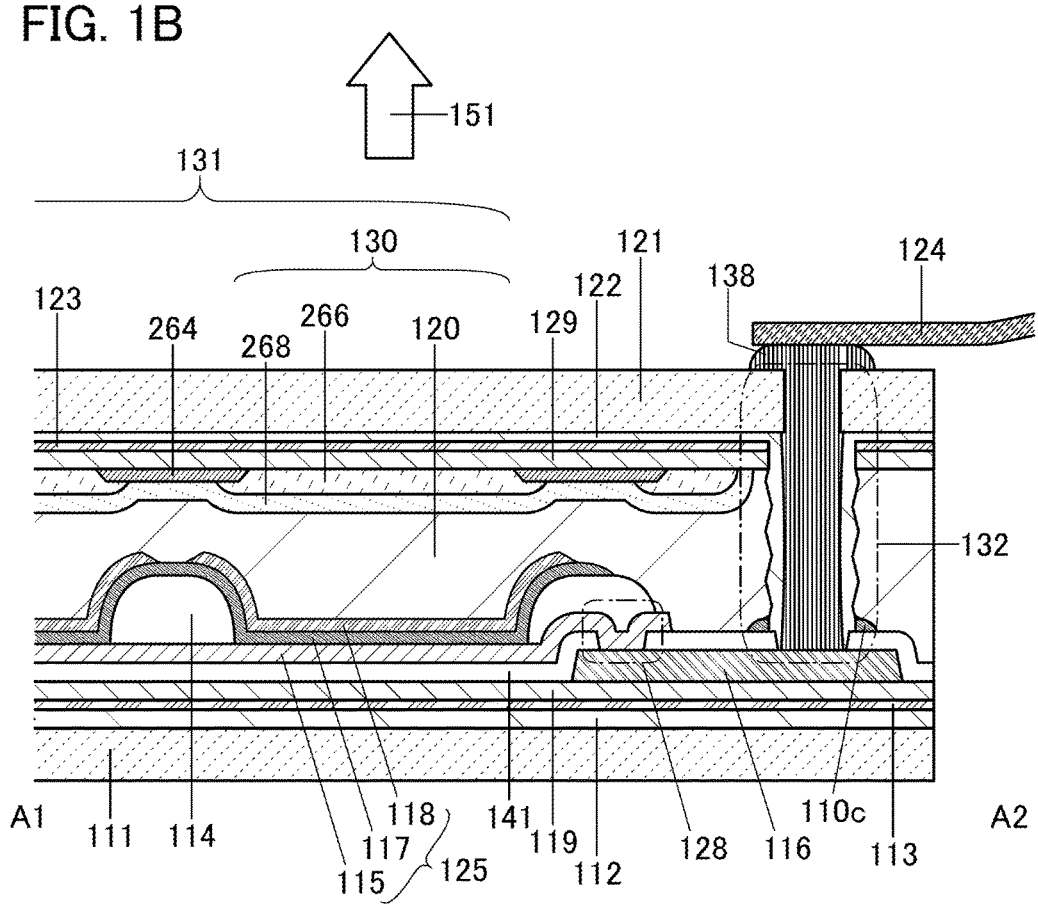

A structure example of a display device 100 of one embodiment of the present invention will be described with reference to FIGS. 1A and 1B, FIGS. 2A and 2B, FIGS. 3A and 3B, FIGS. 4A to 4E, FIGS. 5A to 5D, FIGS. 6A to 6F, FIGS. 7A to 7C, FIGS. 8A and 8B, FIGS. 9A and 9B, FIGS. 10A and 10B, FIGS. 11A and 11B, FIGS. 12A and 12B, and FIGS. 13A and 13B. FIG. 1A is a perspective view of the display device 100 to which an external electrode 124 is connected, and FIG. 1B is a cross-sectional view taken along the dashed-dotted line A1-A2 in FIG. 1A. Note that the display device 100 disclosed in this specification is a display device in which a light-emitting element is used as a display element. As the display device 100 of one embodiment of the present invention, a display device having a top-emission structure is described as an example. Note that the display device 100 of one embodiment of the present invention can be a display device having a bottom-emission structure or a dual-emission structure.

<Structure of Display Device 100>

The display device 100 in FIGS. 1A and 1B is an example of a passive-matrix display device. The display device 100 includes a display region 131, and the display region 131 includes a plurality of pixels 130. Each pixel 130 includes at least one light-emitting element 125.

The display device 100 described in this embodiment includes an electrode 115, an EL layer 117, an electrode 118, a partition 114, and an electrode 116. The display device 100 further includes an insulating layer 141 over the electrode 116, and the electrode 115 and the electrode 116 are electrically connected to each other in an opening 128 provided in the insulating layer 141. The partition 114 is provided over the electrode 115, the EL layer 117 is provided over the electrode 115 and the partition 114, and the electrode 118 is provided over the EL layer 117.

The light-emitting element 125 is provided over a substrate 111 with a bonding layer 112, an organic film 113, an insulating layer 119, and the insulating layer 141 provided therebetween. The light-emitting element 125 includes the electrode 115, the EL layer 117, and the electrode 118.

The display device 100 described in this embodiment includes a substrate 121 provided over the electrode 118 with a bonding layer 120 provided therebetween. In addition, the substrate 121 is provided with a light-blocking layer 264, a coloring layer (also referred to as a color filter) 266, and an overcoat layer 268 with a bonding layer 122, an organic film 123, and an insulating layer 129 provided therebetween.

Since the display device 100 described in this embodiment has a top-emission structure, light 151 emitted from the EL layer 117 is extracted from the substrate 121 side. The light 151 (e.g., white light) emitted from the EL layer 117 is partly absorbed when transmitted through the coloring layer 266 and converted into light with a specific color. In other words, the coloring layer 266 transmits light with a specific wavelength range. The coloring layer 266 can function as an optical filter layer for converting the light 151 into light of a different color.

Although the electrode 116 has a single-layer structure in this embodiment, the electrode 116 may have a stacked-layer structure of two or more layers.

Each of the substrate 121, the bonding layer 122, the organic film 123, the insulating layer 129, the bonding layer 120, and the insulating layer 141 has an opening. The openings partly overlap with one another and each overlap with the electrode 116. In this specification and the like, these openings are collectively referred to as an opening 132. In the opening 132, the external electrode 124 and the electrode 116 are electrically connected to each other through an anisotropic conductive connection layer 138.

A peeling layer 110c is a layer that remains over the insulating layer 141 near the opening 132 during the manufacturing process of the display device 100. The peeling layer 110c will be described later in the manufacturing method of the display device.

Figure 2A:
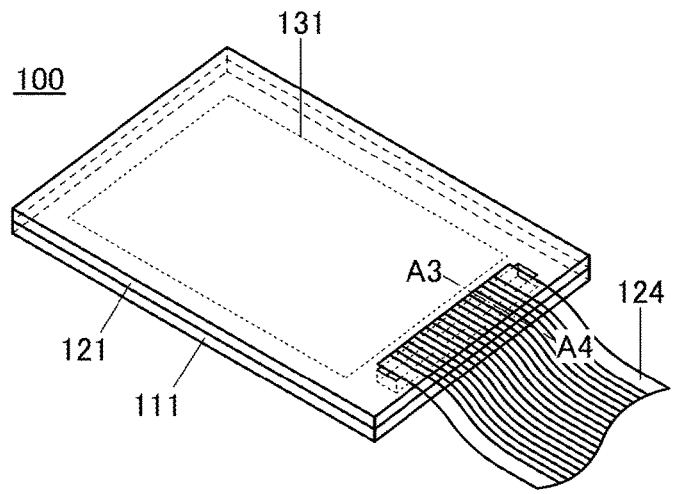
FIGS. 2A and 2B are a perspective view and a cross-sectional view illustrating one embodiment of a display device.
Figure 2B:
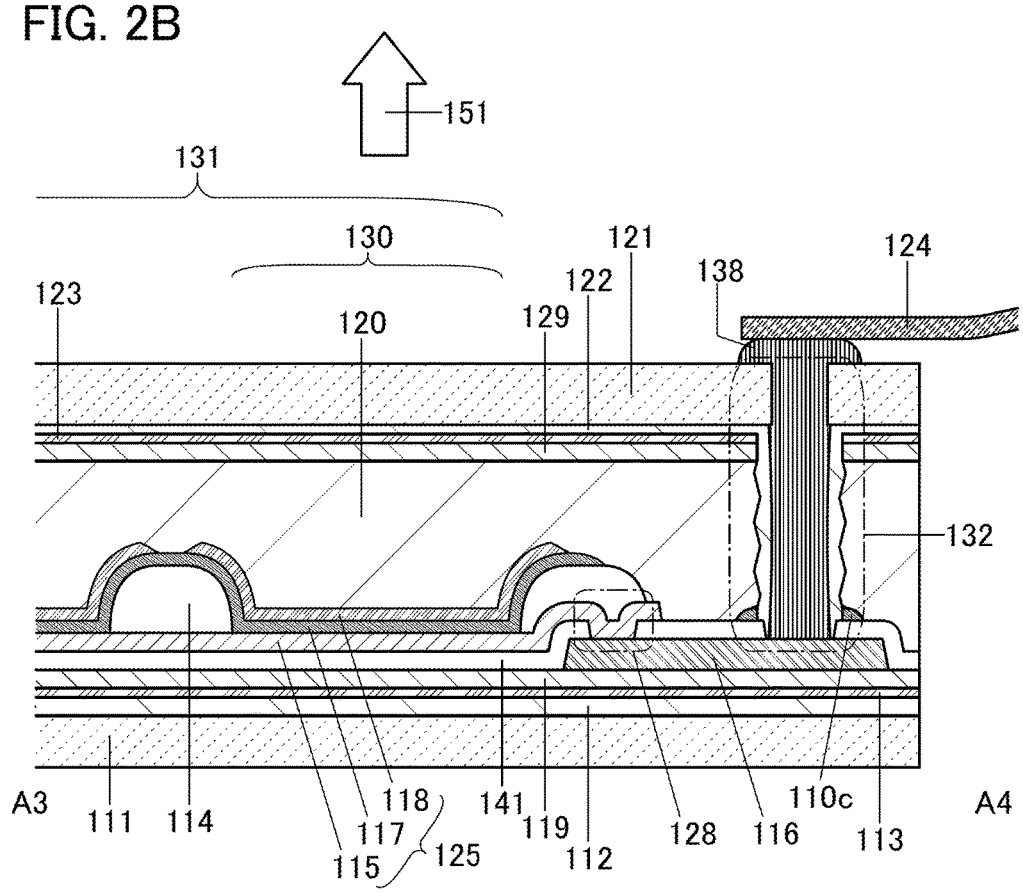

Note that as illustrated in FIGS. 2A and 2B, it is possible not to provide the light-blocking layer 264, the coloring layer 266, and the overcoat layer 268 in the display device 100. FIG. 2A is a perspective view of the display device 100 in which the light-blocking layer 264, the coloring layer 266, and the overcoat layer 268 are not provided, and FIG. 2B is a cross-sectional view taken along the dashed-dotted line A3-A4 in FIG. 2A.

In particular, in the case where the EL layer 117 is provided by what is called side-by-side patterning in which the colors of the lights 151 emitted from different pixels are different, the coloring layer 266 may be provided or is not necessarily provided.

When at least one or all of the light-blocking layer 264, the coloring layer 266, and the overcoat layer 268 are not provided, the display device 100 can achieve a reduction in manufacturing cost, yield improvement, or the like. Moreover, the light 151 can be emitted efficiently when the coloring layer 266 is not provided; therefore, luminance can be improved or power consumption can be reduced, for example.

When the light-blocking layer 264, the coloring layer 266, and the overcoat layer 268 are provided, reflection of external light is suppressed and thus a contrast ratio, color reproducibility, or the like can be improved.

Figure 3A:
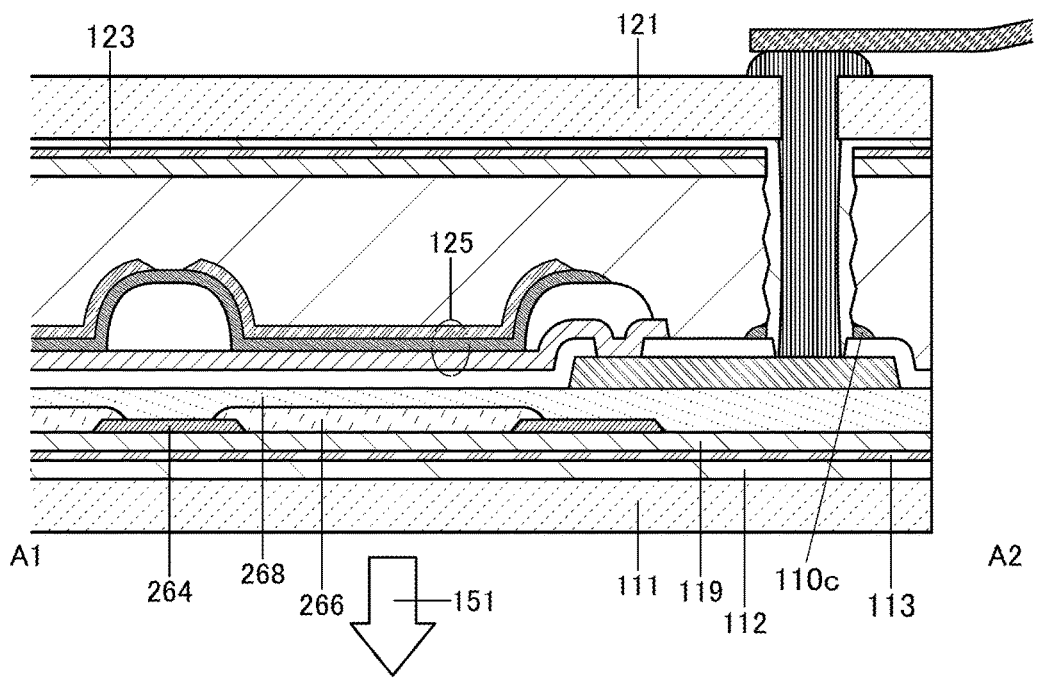
FIGS. 3A and 3B are cross-sectional views each illustrating one embodiment of a display device.
Figure 3B:
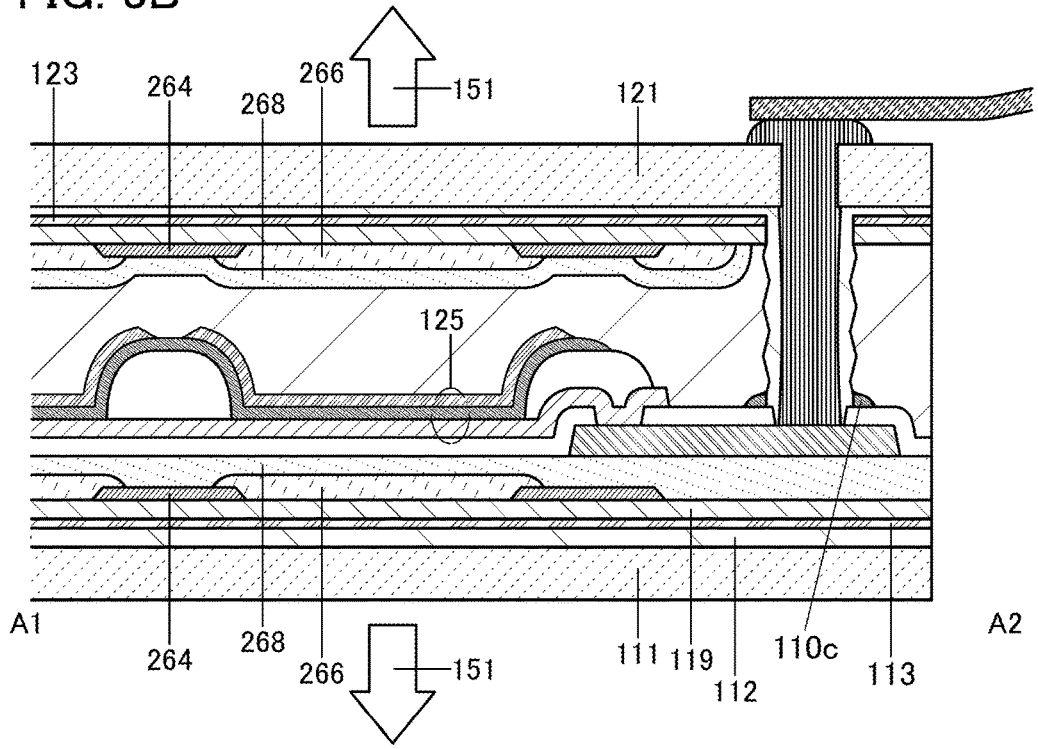

Note that in the case where the display device 100 has a bottom-emission structure, the light-blocking layer 264, the coloring layer 266, and the overcoat layer 268 may be provided on the substrate 111 side (see FIG. 3A). In the case where the display device 100 has a dual-emission structure, the light-blocking layer 264, the coloring layer 266, and the overcoat layer 268 may be provided on either or each of the substrate 111 side and the substrate 121 side (see FIG. 3B).

A switching element having a function of supplying a signal to the light-emitting element 125 may be provided between the light-emitting element 125 and the electrode 116. For example, a transistor may be provided between the light-emitting element 125 and the electrode 116.

A transistor is a kind of semiconductor element and enables amplification of current and/or voltage, switching operation for controlling conduction or non-conduction, or the like. Providing a transistor between the light-emitting element 125 and the electrode 116 can make it easier to increase the area and resolution of the display region 131. Note that a resistor, an inductor, a capacitor, a rectifier element, or the like, without limitation to a switching element such as a transistor, can be provided in the display region 131.

[Substrates 111 and 121]

An organic resin material, a glass material that is thin enough to have flexibility, or the like can be used for the substrate 111 and the substrate 121. In the case where the display device 100 has a bottom-emission structure or a dual-emission structure, a material having a light-transmitting property with respect to light emitted from the EL layer 117 is used for the substrate 111. In the case where the display device 100 has a top-emission structure or a dual-emission structure, a material having a light-transmitting property with respect to light emitted from the EL layer 117 is used for the substrate 121.

As a material having flexibility and transmitting visible light that can be used for the substrate 111 and the substrate 121, the following can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, or the like. Alternatively, a mixture or a stack including any of these materials may be used. Note that the same material or different materials may be used for the substrate 111 and the substrate 121.

The thermal expansion coefficients of the substrate 111 and the substrate 121 are preferably less than or equal to 30 ppm/K, more preferably less than or equal to 10 ppm/K. On surfaces of the substrate 121 and the substrate 111, a protective film having low water permeability may be formed; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also referred to as prepreg) may be used as the substrate 111 and the substrate 121.

[Organic Films 113 and 123]

The organic film 113 and the organic film 123 are preferably formed using a resin material with photosensitivity. Specifically, the organic film 113 and the organic film 123 are preferably formed by light irradiation using a light curable resin material. The resin material to be used is not limited to a light curable resin and, in some cases, the organic film 113 and the organic film 123 may be formed by heat treatment using a resin material with a thermosetting property.

The thickness of the organic film 113 and the organic film 123 is preferably small, specifically, greater than or equal to 0.01 μm and less than 10 μm, preferably greater than or equal to 0.1 μm and less than 3 μm. Thinly forming the organic film 113 and the organic film 123 can reduce the manufacturing cost of the display device 100. In addition, the display device 100 can be lightweight and thin. In addition, the display device 100 can have higher flexibility. In the case where the display device 100 has a bottom-emission structure or a dual-emission structure, thinly forming the organic film 113 can reduce absorption of light emitted from the light-emitting element 125 and extract light to the outside with higher efficiency, which can decrease power consumption of the display device 100. Similarly, in the case where the display device 100 has a top-emission structure or a dual-emission structure, thinly forming the organic film 123 can reduce absorption of light emitted from the light-emitting element 125 and extract light to the outside with higher efficiency, which can decrease power consumption of the display device 100.

In the case where a photosensitive resin material is used for the organic film 113 and the organic film 123, the organic film 113 and the organic film 123 are formed by light irradiation. Thus, the resin material used for the organic film 113 and the organic film 123 preferably has a function of absorbing light for curing the resin and a function of transmitting visible light emitted from the light-emitting element 125. For the former function, the resin material preferably contains a compound having a function of absorbing light in a wavelength region of ultraviolet light. The wavelengths in the wavelength region are longer than or equal to 300 nm and shorter than or equal to 450 nm, preferably longer than or equal to 300 nm and shorter than or equal to 400 nm. Although various resin materials such as acrylic, polyimide, and silicone (having a siloxane bond) can be used for the organic film 113 and the organic film 123, the use of polyimide is preferable because of its excellence in heat resistance, blocking of impurities, and the like.

The thermal expansion coefficient of the organic film 113 and the organic film 123 is preferably greater than or equal to 0.1 ppm/° C. and less than or equal to 20 ppm/° C., and more preferably greater than or equal to 0.1 ppm/° C. and less than or equal to 10 ppm/° C. The lower the thermal expansion coefficient of the organic film 113 and the organic film 123 is, the more the breakage of the transistor or the like by stress caused by expansion or contraction due to heating can be suppressed.

[Insulating Layer 119]

The insulating layer 119 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 119 may have, for example, a two-layer structure of silicon oxide and silicon nitride or a five-layer structure in which materials selected from the above are combined. The insulating layer 119 can be formed by a sputtering method, a CVD method, a thermal oxidation method, a coating method, a printing method, or the like.

The insulating layer 119 can prevent or reduce diffusion of an impurity element from the substrate 111, the bonding layer 112, the organic film 113, or the like to the light-emitting element 125.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

[Electrode 116]

The electrode 116 can be formed using a conductive material. For example, a metal element selected from aluminum, chromium, copper, silver, gold, platinum, tantalum, nickel, titanium, molybdenum, tungsten, hafnium, vanadium, niobium, manganese, magnesium, zirconium, beryllium, and the like; an alloy containing any of the above metal elements; an alloy containing a combination of the above metal elements; or the like can be used. Alternatively, a semiconductor typified by polycrystalline silicon including an impurity element such as phosphorus, or silicide such as nickel silicide may be used. There is no particular limitation on the formation method of the conductive material, and a variety of formation methods such as an evaporation method, a CVD method, a sputtering method, and a spin coating method can be employed.

The electrode 116 can also be formed using a conductive material containing oxygen, such as indium tin oxide, indium oxide containing tungsten, indium zinc oxide containing tungsten, indium oxide containing titanium, indium tin oxide containing titanium, indium zinc oxide, or indium tin oxide to which silicon is added. Moreover, a conductive material containing nitrogen, such as titanium nitride, tantalum nitride, or tungsten nitride, can be used. It is also possible to use a stacked-layer structure formed using the above conductive material containing oxygen and a material containing the above metal element.

The electrode 116 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, an aluminum alloy containing one or more elements selected from titanium, tantalum, tungsten, molybdenum, chromium, neodymium, and scandium may be used as the electrode 116.

[Insulating Layer 141]

The insulating layer 141 can be formed using a material and a method that are similar to those of the insulating layer 119.

[Electrode 115]

The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, and a high-reflectance layer may be provided in contact with the layer. Examples of materials that can be used for the high-reflectance layer include an alloy containing aluminum, aluminum, an alloy containing silver, and silver. As an example of the alloy containing silver, an alloy containing silver and palladium and copper can be given.

The display device having a top-emission structure is described as an example in this embodiment. In a display device having a bottom-emission structure or a dual-emission structure, the electrode 115 may be formed using a light-transmitting conductive material.

[Partition 114]

The partition 114 is provided in order to prevent an electrical short circuit between the adjacent electrodes 118. In the case of using a metal mask for formation of the EL layer 117 described later, the partition 114 has a function of preventing the contact of metal mask with a region where the light-emitting element 125 is formed. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[EL Layer 117]

A structure of the EL layer 117 will be described in Embodiment 5.

[Electrode 118]

The electrode 118 is used as a cathode in this embodiment, and thus the electrode 118 is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used. As the buffer layer, an oxide of an alkaline earth metal, a halide, a magnesium-silver, or the like can also be used.

In the case where light emitted from the EL layer 117 is extracted through the electrode 118, the electrode 118 preferably has a property of transmitting visible light.

[Bonding Layers 120, 112, and 122]

A light curable adhesive, a reaction curable adhesive, a thermosetting adhesive, or an anaerobic adhesive can be used as the bonding layer 120, the bonding layer 112, and the bonding layer 122. For example, an epoxy resin, an acrylic resin, or an imide resin can be used. A drying agent (e.g., zeolite) having a size less than or equal to the wavelength of light emitted from the EL layer 117 or a filler (e.g., titanium oxide or zirconium) with a high refractive index is preferably mixed into the bonding layer 120 in the case of a top-emission structure or into the bonding layer 112 in the case of a bottom-emission structure, in which case the efficiency in extraction of light emitted from the EL layer 117 is unlikely to decrease and the reliability of the display device is improved.

[Anisotropic Conductive Connection Layer 138]

The anisotropic conductive connection layer 138 can be formed using any of various kinds of anisotropic conductive films (ACF), anisotropic conductive pastes (ACP), and the like.

The anisotropic conductive connection layer 138 is formed by curing a paste-form or sheet-form material that is obtained by mixing conductive particles to a thermosetting resin or a thermosetting and light curable resin. The anisotropic conductive connection layer 138 exhibits an anisotropic conductive property by light irradiation or thermocompression bonding. As the conductive particles used for the anisotropic conductive connection layer 138, for example, particles of a spherical organic resin coated with a thin-film metal such as Au, Ni, or Co can be used.

<Manufacturing Methods of Display Device>

Next, examples of a method for manufacturing the display device 100 will be described with reference to FIGS. 4A to 4E, FIGS. 5A to 5D, FIGS. 6A to 6F, FIGS. 7A to 7C, FIGS. 8A and 8B, FIGS. 9A and 9B, FIGS. 10A and 10B, FIGS. 11A and 11B, FIGS. 12A and 12B, FIGS. 13A and 13B, and FIGS. 14A to 14C. Each of FIGS. 4A to 4E, FIGS. 5A to 5D, FIGS. 6A to 6F, FIGS. 8A and 8B, FIGS. 9A and 9B, FIGS. 10A and 10B, FIGS. 11A and 11B, and FIGS. 14A to 14C corresponds to a cross-sectional view taken along the dashed-dotted line A1-A2 in FIG. 1A.

[Formation of Organic Film 113]

Figure 4A:
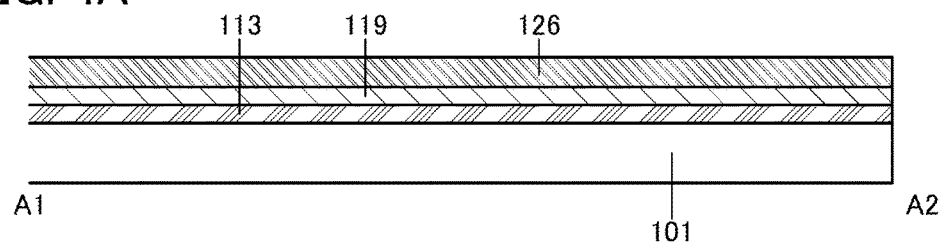
FIGS. 4A to 4E illustrate a manufacturing process of one embodiment of a display device.

First, the organic film 113 is formed over a substrate 101 (see FIG. 4A). Examples of the substrate 101 include a semiconductor substrate (e.g., a single crystal substrate or a silicon substrate), an SOI substrate, a glass substrate, a quartz substrate, a sapphire substrate, a ceramic substrate, a plastic substrate which has heat resistance to the processing temperature in this embodiment, a metal substrate, a stainless steel substrate, a substrate including stainless steel foil, a tungsten substrate, and a substrate including tungsten foil. Examples of a glass substrate include a barium borosilicate glass substrate, an aluminoborosilicate glass substrate, and a soda lime glass substrate.

As an example of the organic film 113, photosensitive polyimide is preferably used. Using a photosensitive resin material, the organic film can be formed easily. Furthermore, using a photosensitive resin material, the organic film with a desired shape can be formed easily. For example, an organic film with an opening, an organic film with two or more regions that are different in thickness, and the like can be formed easily. Such organic films can be formed by an exposure technique using a half-tone mask or a gray-tone mask, a multiple exposure technique, or the like.

A photosensitive resin material can also be suitably used for an insulating film used as a planarizing film, for example. Thus, the material and a formation apparatus can be shared by the organic film for peeling, other insulating films, and the like, which can reduce the manufacturing cost of the display device.

The organic film 113 can be formed by carrying out film formation by a coating method, a printing method, or the like, and then performing curing treatment. Note that the coating method includes a spin coating method, a droplet discharge method, a dispensing method, and a spray coating method. The printing method includes a screen printing method, an offset printing method, and an inkjet printing method.

Specifically, the organic film 113 can be formed by applying a photosensitive resin with low viscosity (e.g., a viscosity of greater than or equal to 5 cP and less than 50 cP) over the substrate 101 and then subjecting the photosensitive resin to light irradiation, for example. Alternatively, the organic film 113 can be formed by applying a thermosetting resin with low viscosity over the substrate 101 and then subjecting the thermosetting resin to heat treatment, for example.

In this embodiment, aluminoborosilicate glass is used for the substrate 101. Photosensitive polyimide is used for the organic film 113 formed over the substrate 101.

[Formation of Insulating Layer 119]

Next, the insulating layer 119 is formed over the organic film 113 (see FIG. 4A). The insulating layer 119 can prevent or reduce diffusion of an impurity element from the substrate 101 or the like. After the substrate 101 is replaced with the substrate 111, the insulating layer 119 can prevent or reduce diffusion of an impurity element from the substrate 111, the bonding layer 112, or the like to the light-emitting element 125. The thickness of the insulating layer 119 is preferably greater than or equal to 30 nm and less than or equal to 2 µm, more preferably greater than or equal to 50 nm and less than or equal to 1 µm, or still more preferably greater than or equal to 50 nm and less than or equal to 500 nm.

Note that the insulating layer 119 can be omitted in some cases. By not forming the insulating layer 119, time required for production of the display device 100 can be shortened, for example. In the case where the display device 100 has a bottom-emission structure or a dual-emission structure, for example, not forming the insulating layer 119 can improve the efficiency of light emission from the light-emitting element 125 to the substrate 111 side.

[Formation of Electrode 116]

Next, a conductive layer 126 for forming the electrode 116 is formed over the insulating layer 119. As the conductive layer 126, a three-layer metal film in which a layer of aluminum is provided between two layers of molybdenum is formed over the insulating layer 119 by a sputtering method, for example (see FIG. 4A).

After that, a resist mask is formed over the conductive layer 126, and the conductive layer 126 is etched into a desired shape using the resist mask, whereby the electrode 116 is formed. The resist mask can be formed by a lithography method, a printing method, an inkjet method, or the like as appropriate. Formation of the resist mask by an inkjet method needs no photomask; thus, the manufacturing cost can be reduced.

The etching of the conductive layer 126 may be performed by a dry etching method, a wet etching method, or both of them. In the case where the conductive layer 126 is etched by a wet etching method, a solution obtained by mixing phosphoric acid, acetic acid, and nitric acid, a solution containing oxalic acid, a solution containing phosphoric acid, or the like can be used as an etchant. After the etching treatment, the resist mask is removed (see FIG. 4B).

Figure 4B:
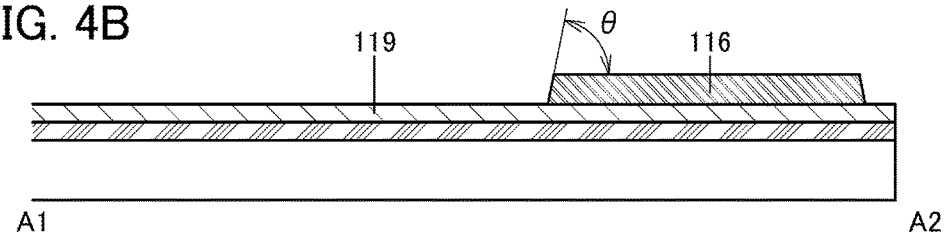

When the electrode 116 (including other electrodes and wirings formed using the same layer) has a taper-shaped end portion, the coverage with a layer that covers the side surfaces of the electrode 116 can be improved. Specifically, the end portion has a taper angle θ of 80° or less, preferably 60° or less, further preferably 45° or less. Note that the "taper angle" refers to an inclination angle formed by a side surface and a bottom surface. The shape of an end portion having a taper angle smaller than 90° is called a forward tapered shape, and the shape of an end portion having a taper angle larger than or equal to 90° is called an inverse tapered shape. FIG. 4B illustrates the case where the end portion of the electrode 116 has a forward tapered shape.

Alternatively, the cross-sectional shape of the end portion of the electrode 116 has a plurality of steps, so that the coverage with the layer formed thereon can be improved. The above description is not limited to the electrode 116 and, when the end portion of each layer has a forward tapered shape or a step-like shape in a cross section, a phenomenon that a layer formed to cover the end portion is cut (disconnection) at the end portion can be prevented, so that the coverage becomes favorable.

[Formation of Insulating Layer 127]

Figure 4C:
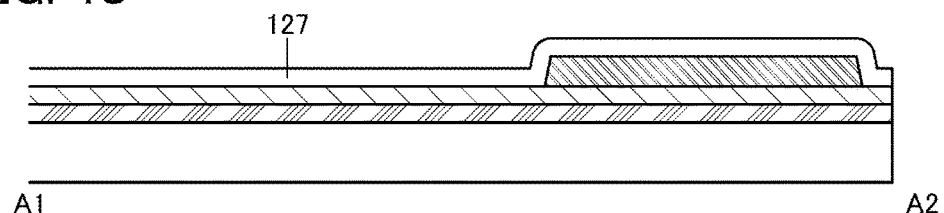

Next, an insulating layer 127 is formed over the electrode 116 (see FIG. 4C). In this embodiment, a silicon oxynitride film is formed by a plasma CVD method as the insulating layer 127.

Figure 4D:
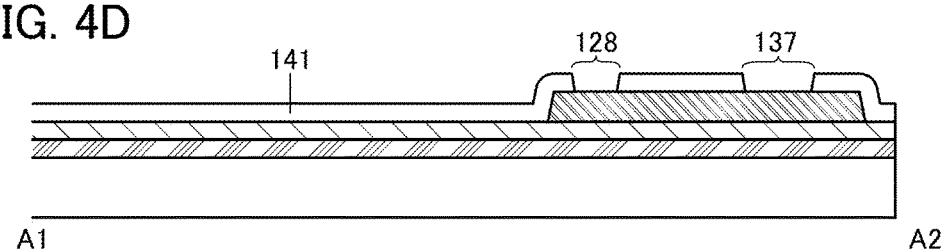

Then, a resist mask is formed over the insulating layer 127, and part of the insulating layer 127 overlapping with the electrode 116 is selectively removed using the resist mask, so that the insulating layer 141 having the opening 128 and an opening 137 is formed (see FIG. 4D). The etching of the insulating layer 127 may be performed by a dry etching method, a wet etching method, or both of them.

[Formation of Electrode 115]

Figure 4E:
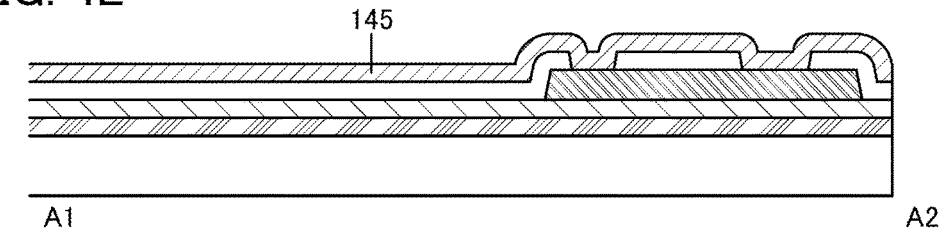

Next, a conductive layer 145 for forming the electrode 115 is formed over the insulating layer 141 (see FIG. 4E). The conductive layer 145 can be formed using a material and a method similar to those of the conductive layer 126 (the electrode 116).

Figure 5A:
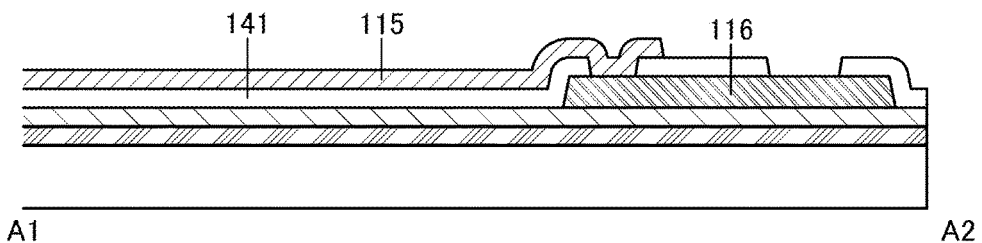
FIGS. 5A to 5D illustrate a manufacturing process of one embodiment of a display device.

Then, a resist mask is formed over the conductive layer 145, and part of the conductive layer 145 is selectively removed using the resist mask, so that the electrode 115 is formed (see FIG. 5A). The etching of the conductive layer 145 may be performed by a dry etching method, a wet etching method, or both of them. In this embodiment, the conductive layer 145 (electrode 115) is formed using a material in which indium tin oxide is stacked over silver. The electrode 115 and the electrode 116 are electrically connected to each other through the opening 128.

[Formation of Partition 114]

Figure 5B:
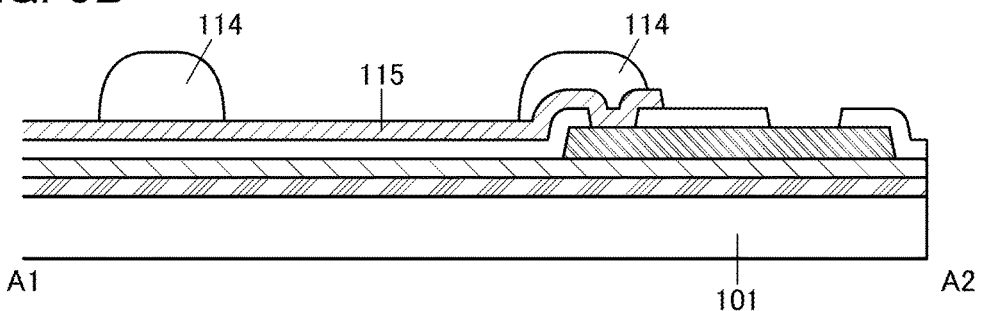

Next, the partition 114 is formed (see FIG. 5B). In this embodiment, the partition 114 is formed in such a manner that a photosensitive organic resin material is applied by a coating method and processed into a desired shape. In this embodiment, the partition 114 is formed using a photosensitive polyimide resin.

[Formation of EL Layer 117, Electrode 118, and Peeling Layer 110]

In this embodiment, a peeling layer 110 having a two-layer structure of a peeling layer 110a formed using the same material as the EL layer 117 and a peeling layer 110b formed using the same material as the electrode 118 is formed. Such a structure is preferable because the peeling layer 110 can be formed without an increase in the number of manufacturing steps.

Figure 5C:
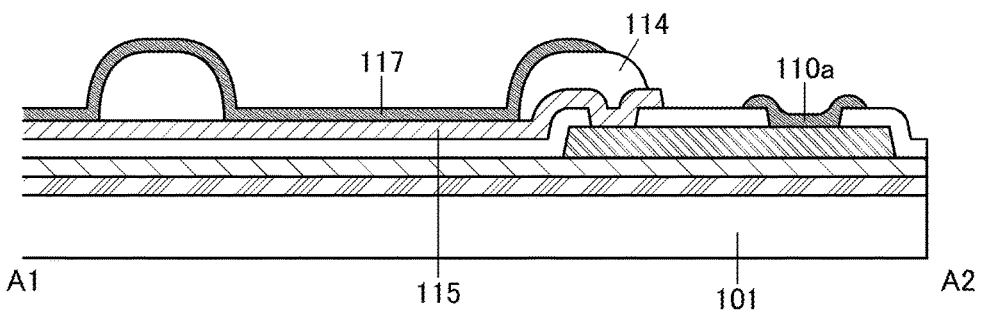
Figure 5D:
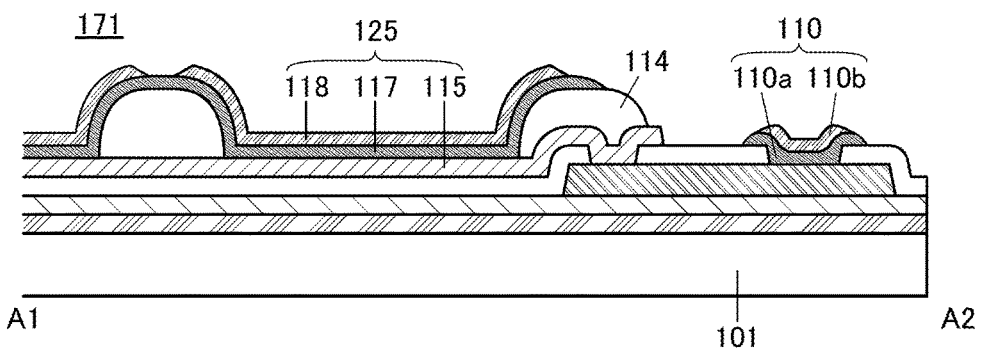

After the formation of the partition 114, the EL layer 117 is formed over the electrode 115 and the partition 114 and, by the same process, the peeling layer 110a is formed in a region over the electrode 116 which overlaps with the opening 137 (see FIG. 5C).

Next, the electrode 118 is formed over the EL layer 117 and, by the same process, the peeling layer 110b is formed over the peeling layer 110a. In this embodiment, an alloy of magnesium and silver is used for the electrode 118 and the peeling layer 110b. The electrode 118 and the peeling layer 110b can be formed by an evaporation method, a sputtering method, or the like (see FIG. 5D).

Note that the peeling layer 110 formed in and on the opening 137 over the electrode 116 may be formed to have a single-layer structure or a stacked-layer structure of two or more layers. In the case where the peeling layer 110 has a single-layer structure, the peeling layer 110 can be formed using a material having low adhesion to the electrode 116. In the case where the peeling layer 110 has a stacked-layer structure, a plurality of materials can be used so that adhesion between layers in the stack is decreased.

In this embodiment, a substrate 101 over which the light-emitting element 125 is formed is referred to as an element substrate 171.

Next, a method for manufacturing a counter substrate 181 will be described.

[Formation of Organic Film 143]

Figure 6A:
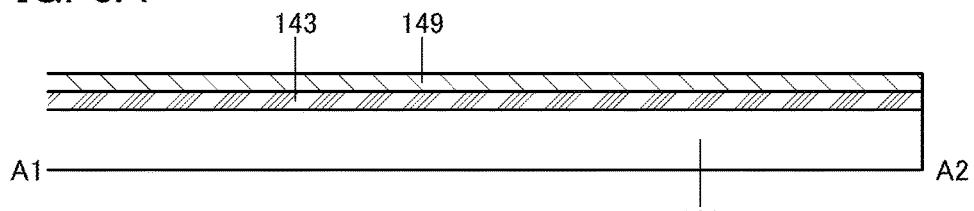
FIGS. 6A to 6F illustrate a manufacturing process of one embodiment of a display device.
Figure 6B:
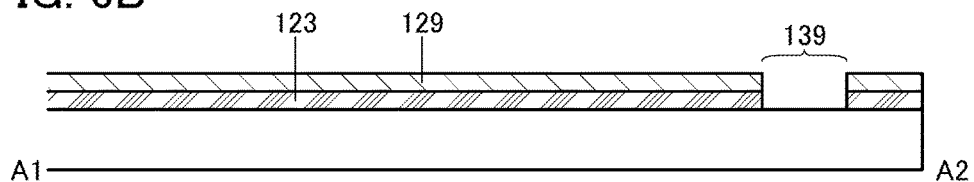

First, an organic film 143 is formed over a substrate 102 (see FIG. 6A). A material similar to that of the substrate 101 can be used for the substrate 102. Note that the same material or different materials may be used for the substrate 101 and the substrate 102. The organic film 143 can be formed in a manner similar to that of the organic film 113. An insulating layer may be provided between the substrate 102 and the organic film 143. In this embodiment, aluminoborosilicate glass is used for the substrate 102. Photosensitive polyimide is used for the organic film 143 formed over the substrate 102.

[Formation of Insulating Layer 149]

Next, an insulating layer 149 is formed over the organic film 143 (see FIG. 6A). The insulating layer 149 can be formed using a material and a method that are similar to those of the insulating layer 119.

[Formation of Organic Film 123 and Insulating Layer 129]

Subsequently, a resist mask is formed over the insulating layer 149, and part of the insulating layer 149 and part of the organic film 143 are selectively removed using the resist mask, so that the organic film 123 and the insulating layer 129 having an opening 139 are formed. The resist mask can be formed by a lithography method, a printing method, an inkjet method, or the like as appropriate. Formation of the resist mask by an inkjet method needs no photomask; thus, the manufacturing cost can be reduced.

The etching of the insulating layer 149 and the organic film 143 may be performed by a dry etching method, a wet etching method, or both of them. After the etching treatment, the resist mask is removed (see FIG. 6B).

In the manufacturing method of one embodiment of the present invention, the formation method and structure of the organic film 123 and the insulating layer 129 are not limited to the above description. For example, first, a resist mask may be formed over the organic film 143 after the formation of the organic film 143 over the substrate 102, then, part of the organic film 143 is selectively removed so that the organic film 123 having the opening 139 is formed. Then, the insulating layer 149 may be formed after the removal of the resist mask. In that case, the insulating layer 149 is formed over the substrate 102 in the opening 139 of the organic film 123 (not shown). Such formation method and structure may also be employed in manufacturing the display device 100.

Note that the insulating layer 129 can be omitted in some cases. By not forming the insulating layer 129, time required for production of the display device 100 can be shortened, for example. In the case where the display device has a top-emission structure or a dual-emission structure, for example, not forming the insulating layer 129 can improve the efficiency of light emission from the light-emitting element 125 to the substrate 121 side.

[Formation of Light-Blocking Layer 264]

Figure 6C:
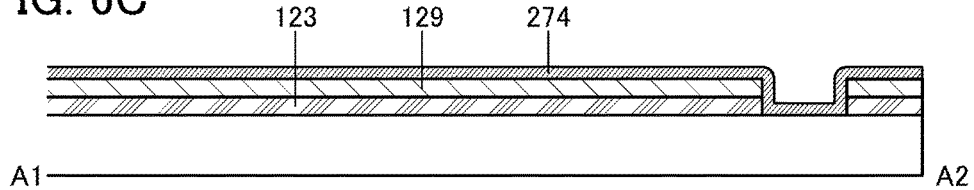

Next, a layer 274 for forming the light-blocking layer 264 is formed over the insulating layer 129 (see FIG. 6C). The layer 274 may have a single-layer structure or a stacked-layer structure of two or more layers. Examples of a material for the layer 274 include a metal material including chromium, titanium, nickel, or the like, and an oxide material including chromium, titanium, nickel, or the like.

Figure 6D:
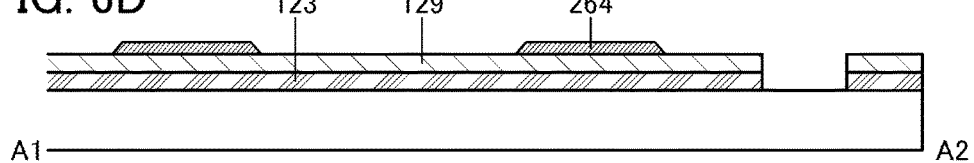

In the case where the layer 274 is formed using the metal material or the oxide material, a resist mask is formed over the layer 274, and the layer 274 is etched into a desired shape using the resist mask, so that the light-blocking layer 264 is formed (see FIG. 6D). With a macromolecular material in which carbon black is dispersed, direct writing of the light-blocking layer 264 can be performed over the insulating layer 129 by an inkjet method.

[Formation of Coloring Layer 266]

Figure 6E:
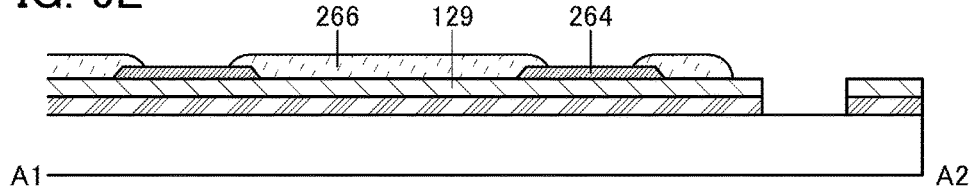

Next, the coloring layer 266 is formed over the insulating layer 129 (see FIG. 6E). Each coloring layer 266 is formed in a desired position using any of various materials by a printing method, an inkjet method, or a photolithography method. At this time, the coloring layer 266 is preferably provided so as to partly overlap with the light-blocking layer 264. Providing the coloring layers 266 of different colors in different pixels makes color display possible.

Figure 7A:
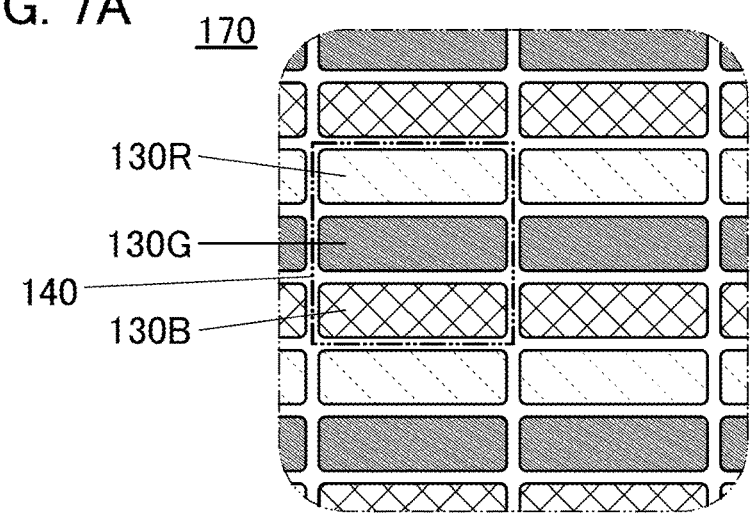
FIGS. 7A to 7C each illustrate an example of a pixel configuration of one embodiment of a display device.
Figure 7B:
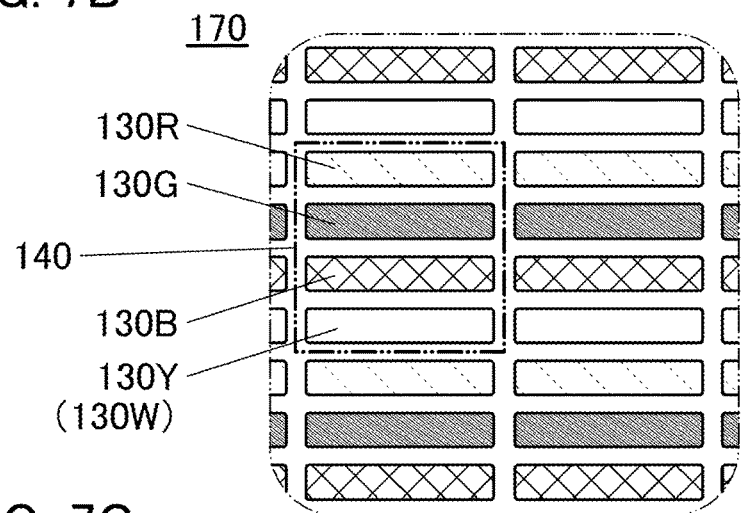
Figure 7C:
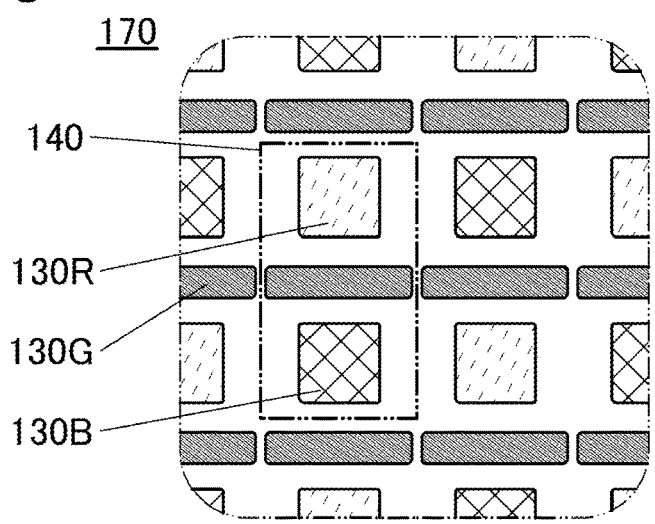
Figure 8A:
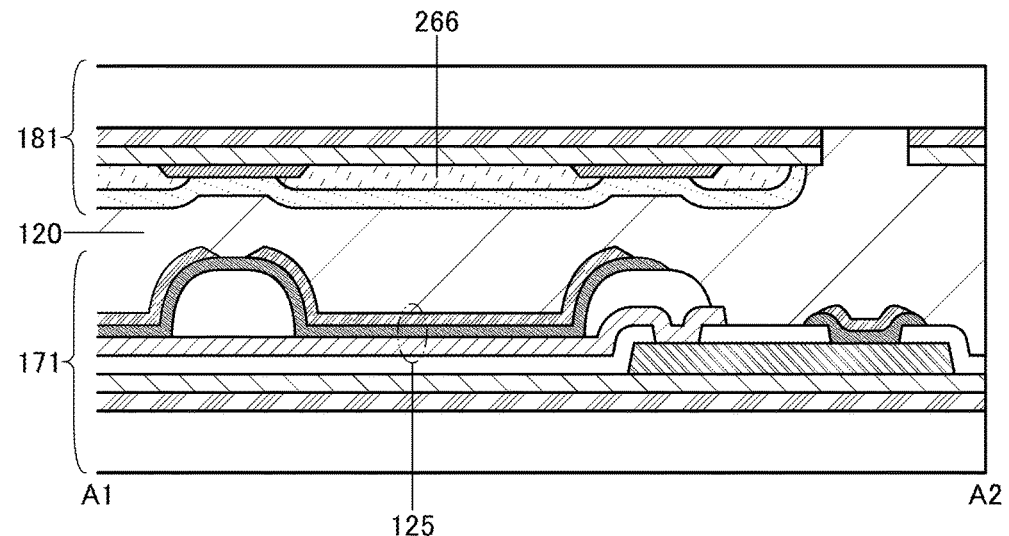
FIGS. 8A and 8B illustrate a manufacturing process of one embodiment of a display device.
Figure 8B:
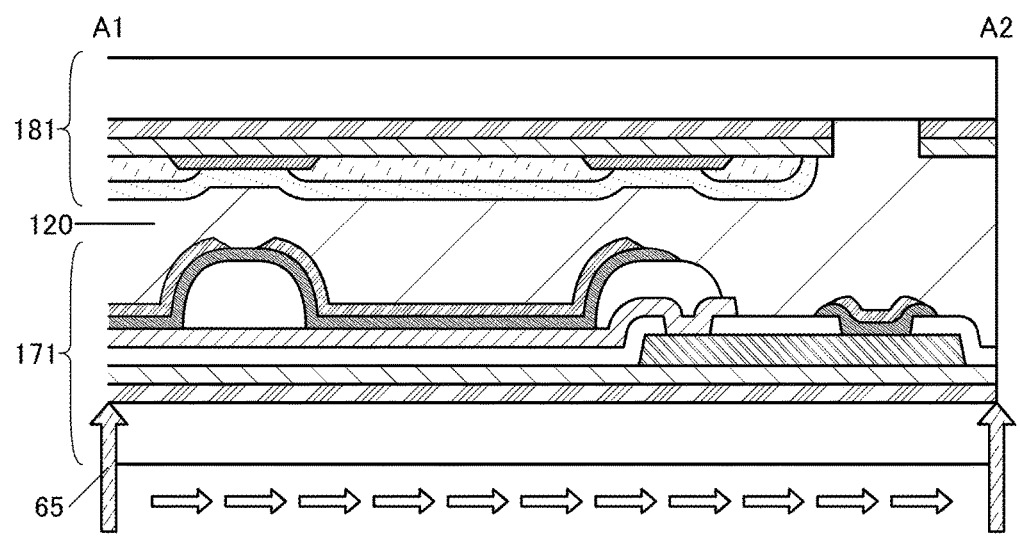

Here, examples of a pixel configuration for achieving color display are described with reference to FIGS. 7A to 7C. FIGS. 7A to 7C are enlarged plan views of a region 170 in the display region 131 of FIG. 1A. For example, as illustrated in FIG. 7A, three pixels 130 arranged in a stripe pattern function as subpixels and can be collectively used as one pixel 140. The use of red, green, and blue coloring layers as the coloring layers 266 for the three pixels 130 enables full-color display. In FIG. 7A, the pixel 130 emitting red light, the pixel 130 emitting green light, and the pixel 130 emitting blue light are illustrated as a pixel 130R, a pixel 130G, and a pixel 130B, respectively. The colors of the coloring layers 266 may be other colors than red, green, and blue; for example, the colors of the coloring layer 266 may be yellow, cyan, magenta, or the like.

As illustrated in FIG. 7B, four pixels 130 may function as subpixels and may be collectively used as one pixel 140. For example, the coloring layers 266 corresponding to the four pixels 130 may be red, green, blue, and yellow. In FIG. 7B, the pixel 130 emitting red light, the pixel 130 emitting green light, the pixel 130 emitting blue light, and the pixel 130 emitting yellow light are illustrated as a pixel 130R, a pixel 130G, a pixel 130B, and a pixel 130Y, respectively. By increasing the number of pixels 130 used as one pixel 140, the color reproducibility can be particularly improved, and the display quality of the display device can be improved.

Alternatively, in FIG. 7B, the coloring layers 266 corresponding to the four pixels 130 may be red, green, blue, and white. With the pixel 130 emitting white light (pixel 130W), the luminance of the display region can be increased. Note that the coloring layer 266 does not need to be provided for the pixel 130 emitting white light. Without a white coloring layer 266, there is no luminance reduction at the time of transmitting light through the coloring layer 266; thus, power consumption of the display device can be reduced. With provision of the white coloring layer 266, the color temperature of white light can be controlled; thus, the display quality of the display device can be improved. Depending on the intended use of the display device, given two pixels 130 of the four pixels may be used as one pixel 140.

Note that the occupation areas or shapes of the pixels 130 may be the same or different from each other. In addition, arrangement is not limited to stripe arrangement. For example, delta arrangement, Bayer arrangement, pentile arrangement, or the like can be used. FIG. 7C illustrates an example of three pixels 130 arranged in a pentile pattern.

[Formation of Overcoat Layer 268]

Figure 6F:
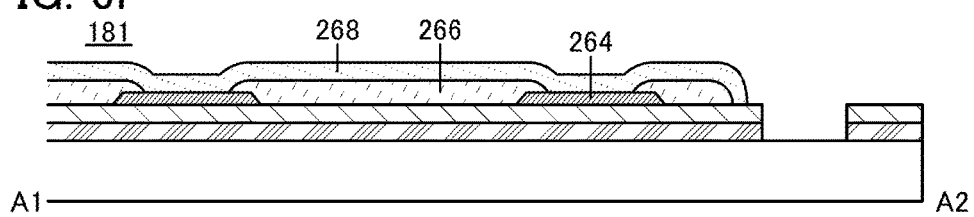

Next, the overcoat layer 268 is formed over the light-blocking layer 264 and the coloring layer 266 (see FIG. 6F).

As the overcoat layer 268, an organic insulating layer of an acrylic resin, an epoxy resin, polyimide, or the like can be used. With the overcoat layer 268, an impurity or the like contained in the coloring layer 266 can be inhibited from diffusing into the light-emitting element 125 side, for example. Although the overcoat layer 268 is not formed in the opening 139 in FIG. 6F, the overcoat layer 268 may be formed in the opening 139. Note that it is not necessary to form the overcoat layer 268, and the overcoat layer 268 can be omitted in some cases.

A light-transmitting conductive film may be formed as the overcoat layer 268, in which case the light 151 emitted from the light-emitting element 125 can pass through the overcoat layer 268 while ionized impurities can be prevented from passing through the overcoat layer 268.

The light-transmitting conductive film can be formed using, for example, indium oxide, indium tin oxide, indium zinc oxide, zinc oxide, zinc oxide to which gallium is added, or the like. Graphene or a metal film that is thin enough to have a light-transmitting property can also be used.

In this embodiment, the substrate 102 over which the coloring layers 266 and the like are formed is referred to as a counter substrate 181. Through the above steps, the counter substrate 181 can be formed. Note that the counter substrate 181 is not necessarily provided with the coloring layer 266 or the like.

[Attachment of Element Substrate 171 and Counter Substrate 181]

Next, the element substrate 171 and the counter substrate 181 are attached to each other with the bonding layer 120 provided therebetween. At this time, the element substrate 171 and the counter substrate 181 are arranged such that, the light-emitting element 125 over the element substrate 171 and the coloring layer 266 over the counter substrate 181 face each other, and the peeling layer 110 over the element substrate 171 and the opening 139 on the counter substrate 181 overlap with each other (see FIG. 8A).

[Peeling of Substrate 101]

Next, the substrate 101 included in the element substrate 171 is peeled off from the insulating layer 119. As an example of the peeling method, a method in which the organic film 113 is irradiated with light from a laser can be given (see FIG. 8B). When the organic film 113 is irradiated with laser light 65, adhesion between the insulating layer 119 and the organic film 113 can be decreased. As a result, the substrate 101 included in the element substrate 171 can be peeled off from the insulating layer 119 by applying physical force or the like to the substrate 101 (see FIG. 9A).

A linear laser beam is preferably used as the laser light 65 when a region between the substrate 101 and the organic film 113 is irradiated with the laser light 65. In this way, the process time for a large-sized element substrate 171 can be shortened. An excimer laser with a wavelength of 308 nm, for example, can be suitably used for the laser light 65.

Figure 9A:
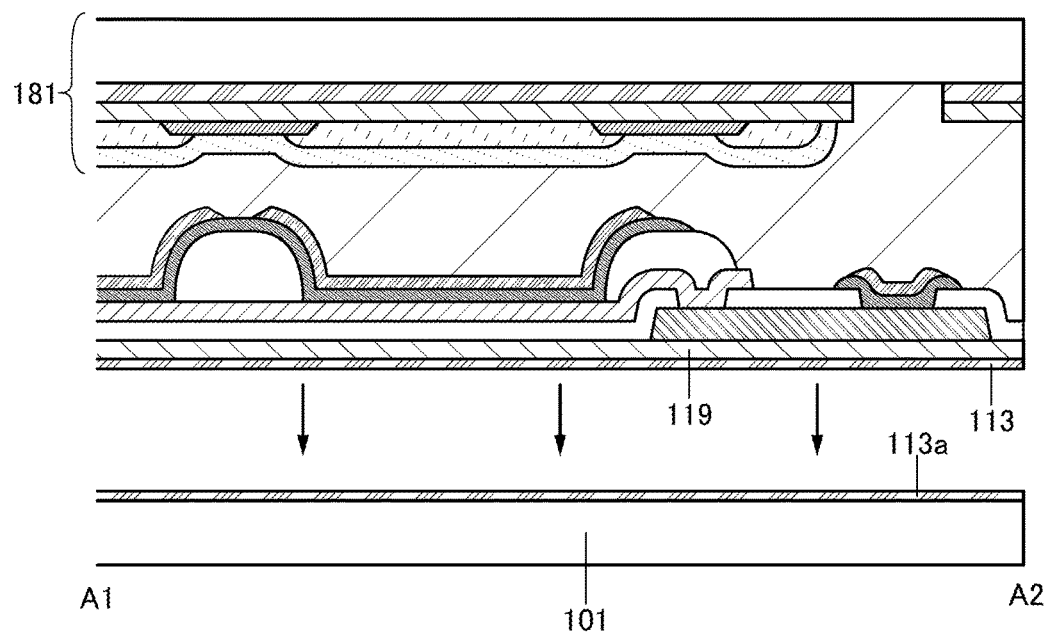
FIGS. 9A and 9B illustrate a manufacturing process of one embodiment of a display device.

FIG. 9A shows an example in which an organic film 113a, which is part of the organic film 113, remains on the substrate 101 side. Depending on the irradiation conditions of the laser light 65, separation (rupture) occurs inside the organic film 113 and the organic film 113a remains like this in some cases. In the case where part of the surface of the organic film 113 melts, part of the organic film 113a may remain on the substrate 101 side in a similar manner. Note that the organic film 113a does not necessarily remain on the substrate 101 side in the case where the substrate 101 and the organic film 113 are separated from each other at the interface.

The thickness of the organic film 113a remaining on the substrate 101 side can be less than or equal to 100 nm, specifically approximately greater than or equal to 40 nm and less than or equal to 70 nm. When the remaining organic film 113a is removed, the substrate 101 can be reused. In the case where glass is used for the substrate 101 and a polyimide resin is used for the organic film 113, for example, the organic film 113a can be removed with fuming nitric acid or the like.

As the aforementioned application of physical force, a peeling process with a human hand or a gripper, a peeling process by rotation of a roller, or ultrasonic waves can be given, for example.

As another example, a process in which a cut is made in the interface between the substrate 101 and the organic film 113 with a sharp edged tool, by laser light irradiation, or the like, and water is injected into the cut can be given. In this way, the water soaks into the interface between the substrate 101 and the organic film 113 by the capillary action, whereby the organic film 113 and the substrate 101 can be easily separated from each other.

[Attachment of Substrate 111]

Figure 9B:
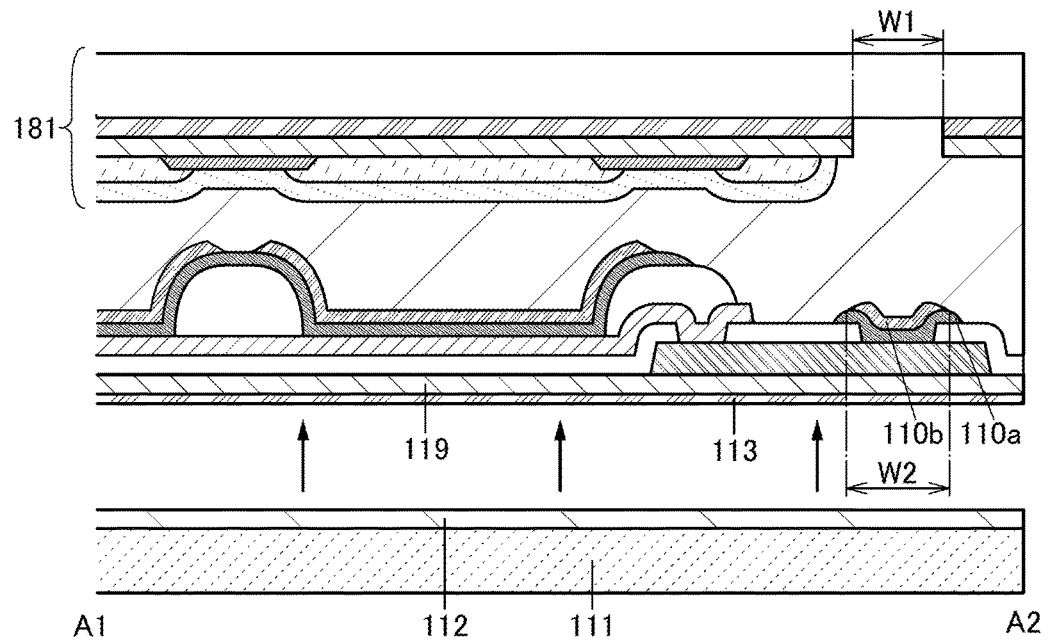

Next, the substrate 111 is attached to the organic film 113 with the bonding layer 112 provided therebetween (see FIG. 9B).

[Peeling of Substrate 102]

Figure 10A:
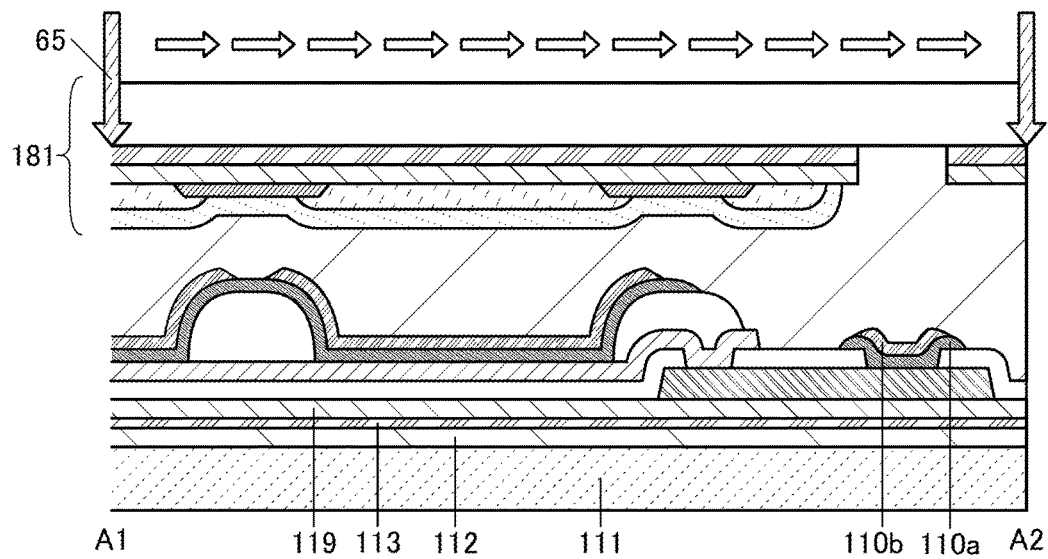
FIGS. 10A and 10B illustrate a manufacturing process of one embodiment of a display device.

Next, the substrate 102 included in the counter substrate 181 is peeled off from the insulating layer 129. Similar to the peeling of the substrate 101, a method in which the organic film 123 is irradiated with light from a laser can be given as an example of the peeling method (see FIG. 10A). Note that the laser light 65 is shown in FIG. 10A as the laser light, and, the description of the laser light 65 used for the peeling of the substrate 101 is referred to for the laser light 65 in FIG. 10A. Thus, the substrate 102 can be peeled off from the insulating layer 129 in a manner similar to the peeling of the substrate 101 from the insulating layer 119.

Figure 10B:
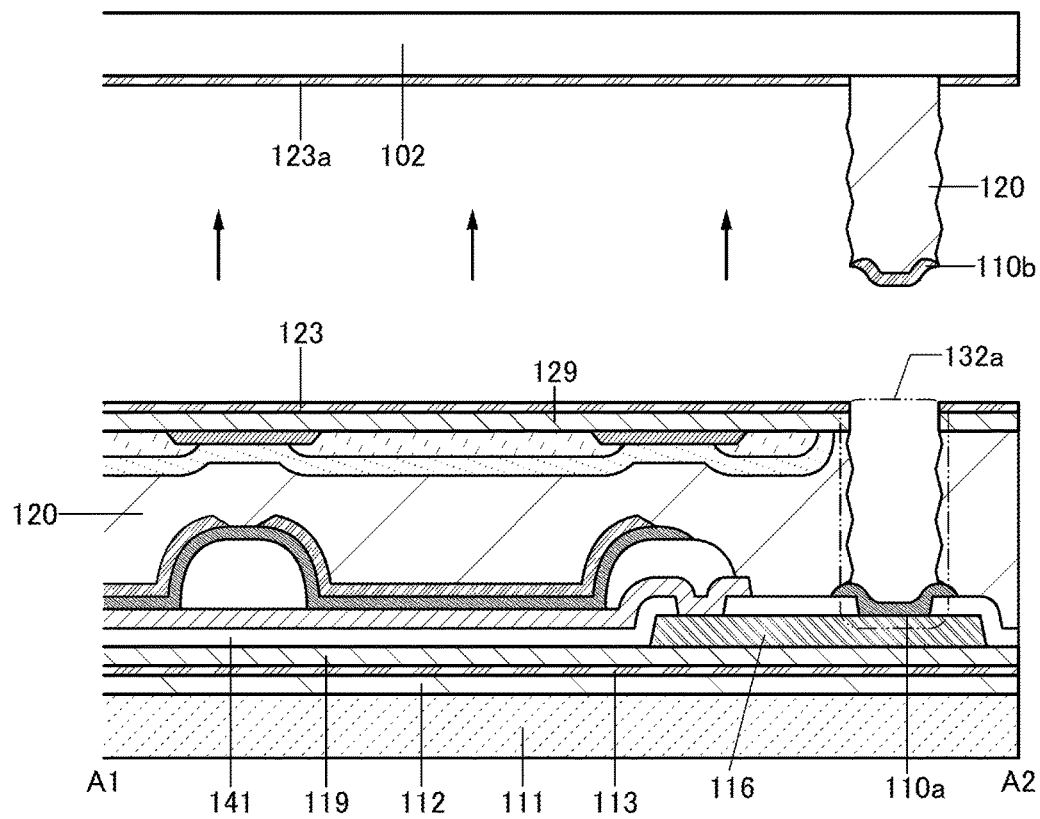

FIG. 10B illustrates a state in which the substrate 102 included in the counter substrate 181 is peeled off from the insulating layer 129. At this time, an opening 132a is formed by removal of part of the bonding layer 120 overlapping substantially with the opening 139 and the peeling layer 110b overlapping substantially with the opening 139. Alternatively, the opening 132a is formed by removal of the bonding layer 120 overlapping substantially with the opening 139, the peeling layer 110b overlapping substantially with the opening 139, and part of the peeling layer 110a overlapping substantially with the opening 139. Note that the substrate 102 is preferably arranged such that the opening 139 is placed on the inner side than the electrode 116, in which case the opening 132a can be formed easily. That is, it is preferable that the opening 132a be formed on the inner side than the end portion of the electrode 116 in the cross-sectional view. The width W1 of the opening 139 is preferably smaller than the width W2 of the surface where the peeling layer 110a and the peeling layer 110b are in contact with each other, in which case the peeling layer 110b is easily peeled off from the peeling layer 110a (see FIG. 9B).

Meanwhile, when the width W1 is smaller than the width W2, part of the peeling layer 110b, which does not overlap with the opening 132a, might be lifted at peeling from the peeling layer 110a in a direction diagonal to the perpendicular direction. Accordingly, in some cases, this part of the peeling layer 110b not overlapping with the opening 132a, part of the bonding layer 120 overlapping with this part, and the like may remain on the peeling layer 110a without being peeled off from the interface with the peeling layer 110a. Therefore, it is preferable that a difference between the width W1 and the width W2 be small.

Note that after the substrate 102 is peeled off from the insulating layer 129, the peeling layer 110a might remain on the electrode 116. When the peeling layer 110a remains on the electrode 116, contact failure might be caused between the electrode 116 and the anisotropic conductive connection layer 138. Thus, after the substrate 102 is peeled off, the remaining peeling layer 110a which is attached to the electrode 116 is preferably removed with, for example, an organic solvent such as acetone. In this embodiment, the peeling layer 110a on the electrode 116 is removed with acetone. Note that it is not necessary to remove the peeling layer 110a remaining on the electrode 116 in the case where it does not cause a problem in electrical connection between the electrode 116 and the anisotropic conductive connection layer 138.

As a method for peeling the substrate 102 off from the insulating layer 129, a method in which physical force or the like is applied, for example, may be used in a manner similar to the above.

FIG. 10B shows an example in which an organic film 123a, which is part of the organic film 123, remains on the substrate 102 side. Depending on the irradiation conditions of the laser light, separation (rupture) occurs inside the organic film 123 and the organic film 123a remains like this in some cases. In the case where part of the surface of the organic film 123 melts, part of the organic film 123a may remain on the substrate 102 side in a similar manner. Note that the organic film 123a does not necessarily remain on the substrate 102 side in the case where the substrate 102 and the organic film 123 are separated from each other at the interface.

The thickness of the organic film 123a remaining on the substrate 102 side can be less than or equal to 100 nm, for example, and more specifically, approximately greater than or equal to 40 nm and less than or equal to 70 nm.

[Attachment of Substrate 121]

Figure 11A:
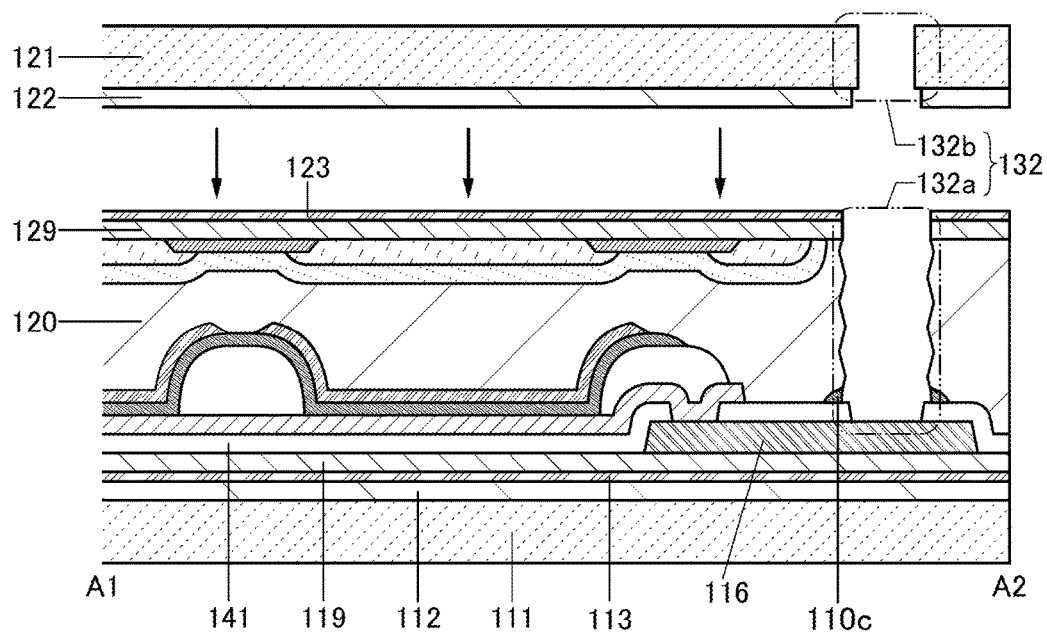
FIGS. 11A and 11B illustrate a manufacturing process of one embodiment of a display device.

Next, the substrate 121 having an opening 132b is attached to the insulating layer 129 with the bonding layer 122 provided therebetween (see FIG. 11A). The attachment is performed such that the openings 132a and 132b overlap with each other. In this embodiment, the openings 132a and 132b are collectively referred to as the opening 132. The surface of the electrode 116 is exposed in the opening 132.

Figure 11B:
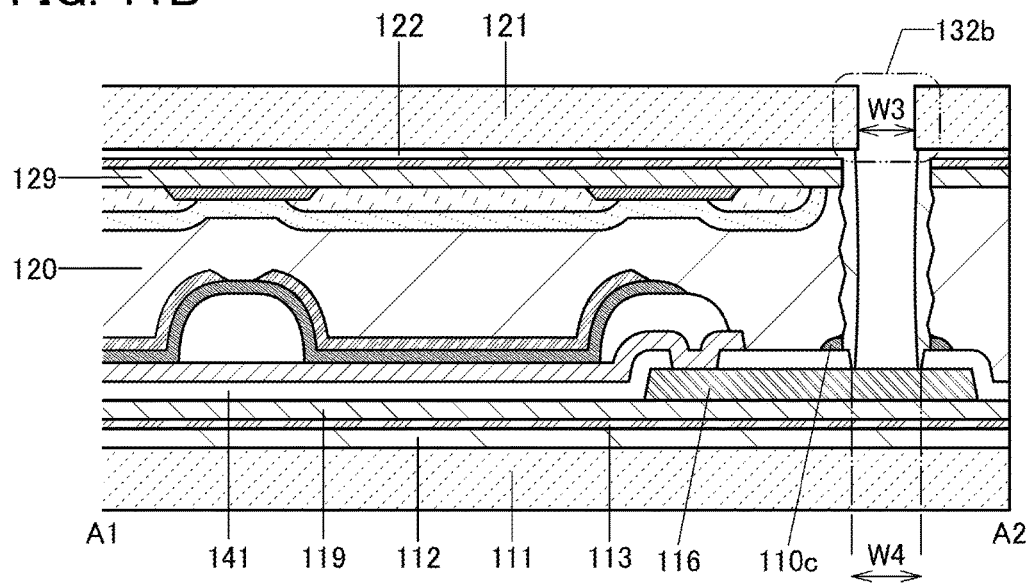

At the attachment of the substrate 121 to the insulating layer 129, the width of the opening 132b, the amount of an adhesive used for the bonding layer 122, or the like is preferably adjusted so that the bonding layer 122 covers side surfaces of the layers in the opening 132a as illustrated in FIG. 11B. In this way, a break or a crack of the insulating layer 129 and the like which are exposed in the side surfaces of the opening 132a can be suppressed. Moreover, after the removal of the peeling layer 110b, the peeling layer 110c remaining on the insulating layer 141 in the vicinity of the opening 132a is covered with the bonding layer 122, so that diffusion of the material for forming the peeling layer 110 into the anisotropic conductive connection layer 138 can be suppressed. For example, the width W3 of the opening 132b is preferably smaller than the width W4 of the opening 132 (see FIG. 11B). FIG. 11B is a cross-sectional view of the display device 100 after the attachment of the substrate 121 to the insulating layer 129.

Figure 12A:
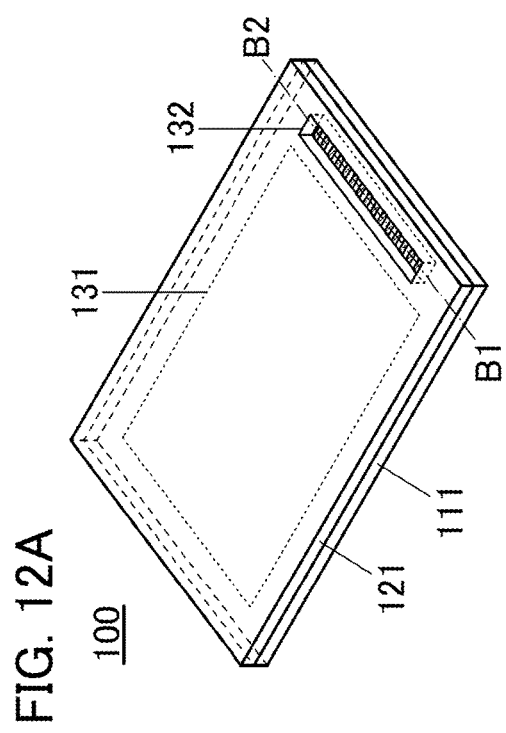
FIGS. 12A and 12B are a perspective view and a cross-sectional view illustrating one embodiment of a display device.
Figure 12B:
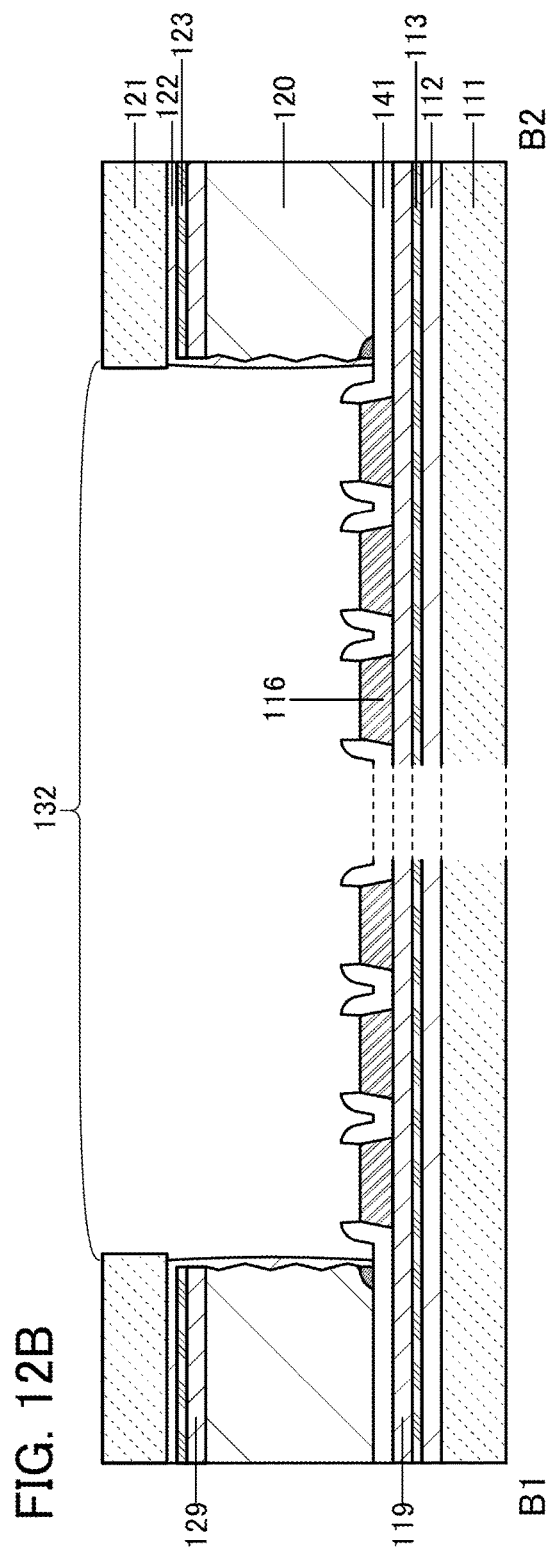
Figure 13A:
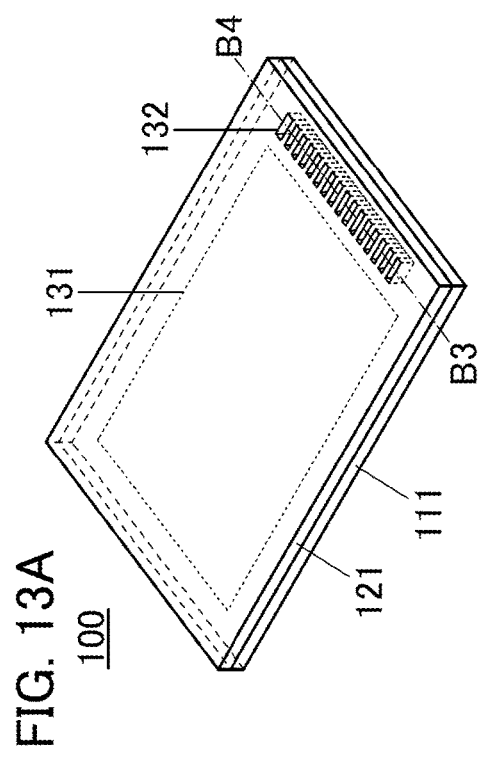
FIGS. 13A and 13B are a perspective view and a cross-sectional view illustrating one embodiment of a display device.
Figure 13B:
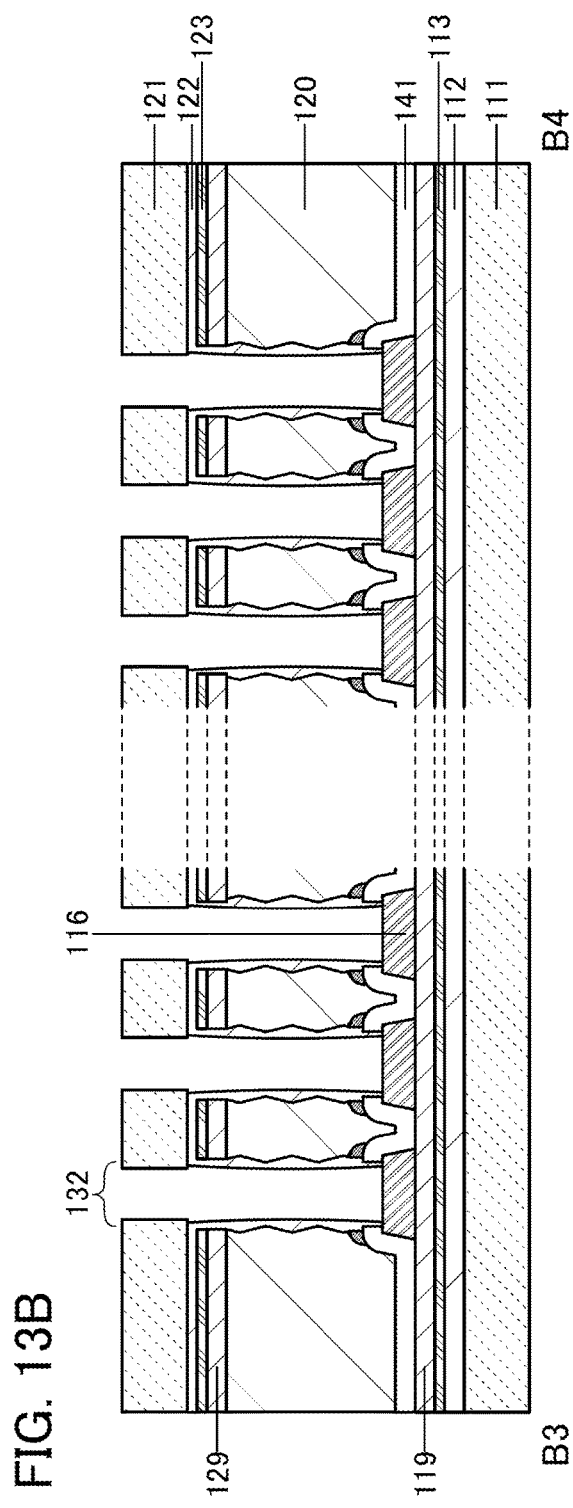

In the display device 100 of one embodiment of the present invention, a plurality of electrodes 116 may be provided in one opening 132 or the opening 132 may be provided for each electrode 116. FIG. 12A is a perspective view of the display device 100 in which a plurality of electrodes 116 are provided in one opening 132, and FIG. 12B is a cross-sectional view taken along the dashed-dotted line B1-B2 in FIG. 12A. FIG. 13A is a perspective view of the display device 100 in which the opening 132 is provided for each electrode 116, and FIG. 13B is a cross-sectional view taken along the dashed-dotted line B3-B4 in FIG. 13A.

The opening 132 is provided on the inner side than the end portion of the substrate 121 in a plan view, so that the outer edge of the opening 132 can be supported by the substrate 121 and the substrate 111. Thus, the mechanical strength of a region where the external electrode 124 and the electrode 116 are connected to each other is unlikely to decrease, and unintentional deformation of the connected region can be reduced. Note that an effect of reducing the deformation of the connected region can be improved in the case where the opening 132 is provided for each electrode 116 as compared with the case where a plurality of electrodes 116 are provided in one opening 132 (see FIG. 13B). According to one embodiment of the present invention, breakage of the display device 100 can be prevented, and the reliability of the display device 100 can be improved.

One or more of layers each formed using a material having a specific function, such as an anti-reflection layer, a light diffusion layer, a microlens array, a prism sheet, a retardation plate, or a polarizing plate, (hereinafter referred to as "functional layers") may be provided on the outside of the substrate 111 or the substrate 121 through which light 151 is emitted. As the anti-reflection layer, for example, a circularly polarizing plate or the like can be used. With the functional layer, a display device having a higher display quality can be achieved. Moreover, power consumption of the display device can be reduced.

Figure 14A:
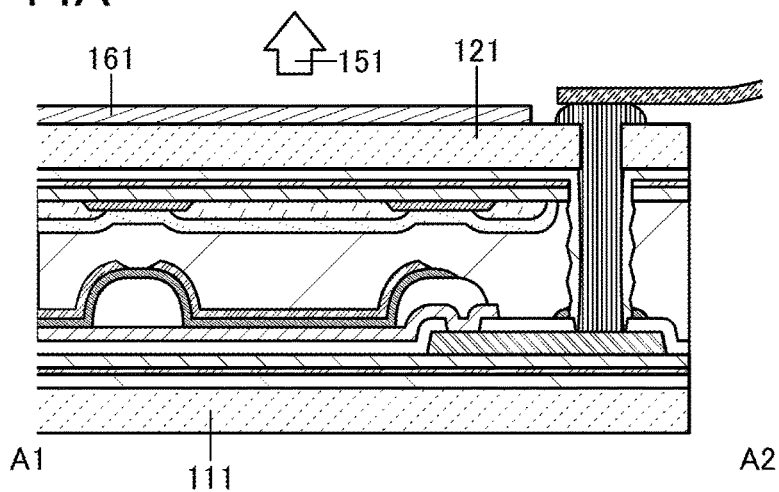
FIGS. 14A to 14C are each a cross-sectional view illustrating one embodiment of a display device.
Figure 14B:
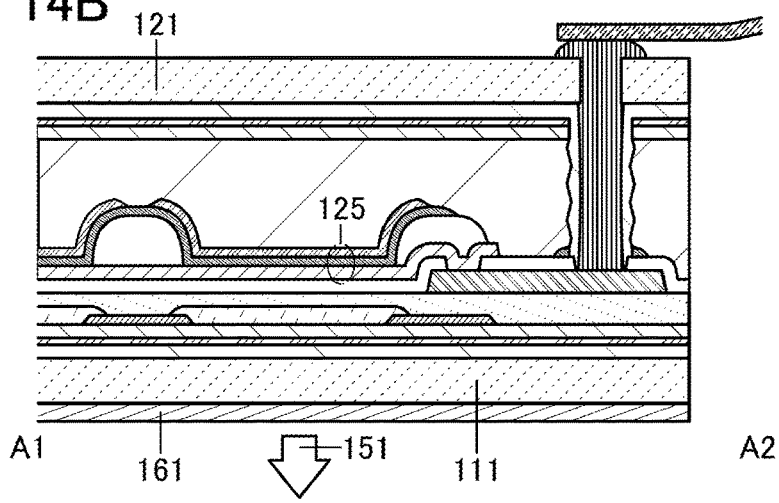
Figure 14C:
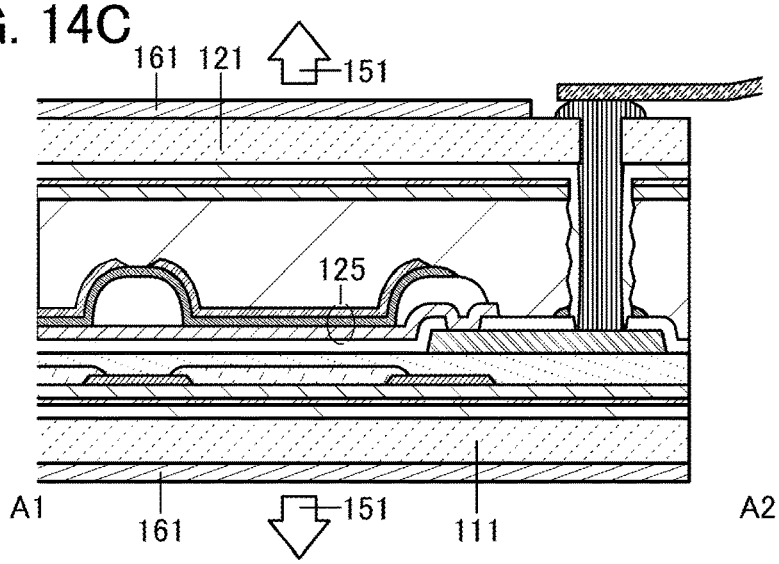

FIG. 14A is a cross-sectional view of the display device 100 having a top-emission structure and including a functional layer 161. FIG. 14B is a cross-sectional view of the display device 100 having a bottom-emission structure and including the functional layer 161. FIG. 14C is a cross-sectional view of the display device 100 having a dual-emission structure and including the functional layer 161.

For the substrate 111 or the substrate 121, a material having a specific function may be used. For example, a circularly polarizing plate may be used as the substrate 111 or the substrate 121. Alternatively, for example, the substrate 111 or the substrate 121 may be formed using a retardation plate, and a polarizing plate may be provided so as to overlap with the substrate. As another example, the substrate 111 or the substrate 121 may be formed using a prism sheet, and a circularly polarizing plate may be provided so as to overlap with the substrate. With the use of the material having a specific function for the substrate 111 or the substrate 121, improvement of display quality and reduction of the manufacturing cost can be achieved.

Note that in consideration of mass production, a plurality of display devices 100 are preferably manufactured from one substrate in such a manner that the plurality of display devices 100 are manufactured over a large-sized substrate and then the large-sized substrate is divided, in which case reduction in manufacturing cost can be achieved. In the case of obtaining a plurality of display devices from one substrate, the individual display devices 100 can be manufactured by dividing the large-sized substrate after the attachment of the substrate 121, for example. As will be described later in Embodiment 2, in the case where a display device includes a transistor and the like, a structure in which a short ring can also be divided in the dividing process of the substrate is preferable. The short ring is a wiring for short-circuiting a plurality of wirings for supplying voltage to a plurality of circuits to prevent current from locally flowing into a certain circuit including a transistor in the case where overcurrent is caused in part of the display device during the manufacturing process of the display device.

[Attachment of External Electrode 124]

Next, the anisotropic conductive connection layer 138 is formed in and on the opening 132, and the external electrode 124 for inputting electric power or a signal to the display device 100 is formed over the anisotropic conductive connection layer 138 (see FIGS. 1A and 1B). The electrode 116 is electrically connected to the external electrode 124 through the anisotropic conductive connection layer 138. Consequently, electric power or a signal can be input to the display device 100. Note that an FPC can be used as the external electrode 124. A metal wire can also be used as the external electrode 124. Although the anisotropic conductive connection layer 138 may be used to connect the metal wire and the electrode 116 to each other, the connection may be performed by a wire bonding method without using the anisotropic conductive connection layer 138. Alternatively, the metal wire and the electrode 116 can be connected to each other by a soldering method.

This embodiment can be implemented in an appropriate combination with any of the structures described in the other embodiments.

Embodiment 2

Figure 15A:
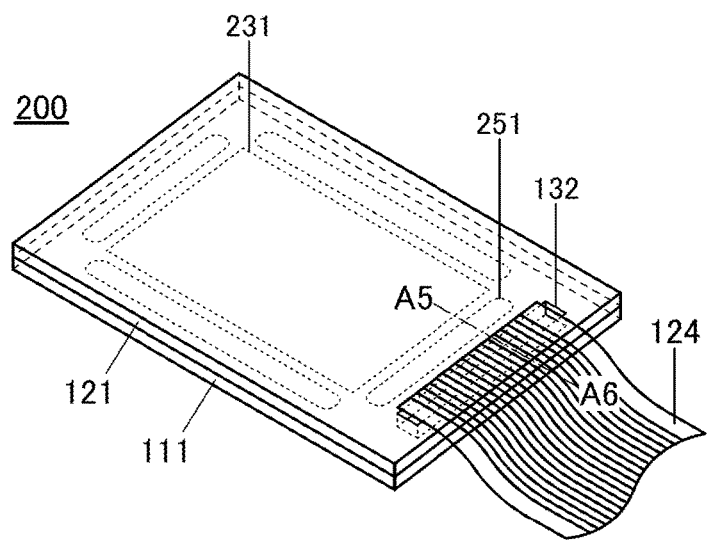
FIGS. 15A and 15B are a perspective view and a cross-sectional view illustrating one embodiment of a display device.
Figure 15B:
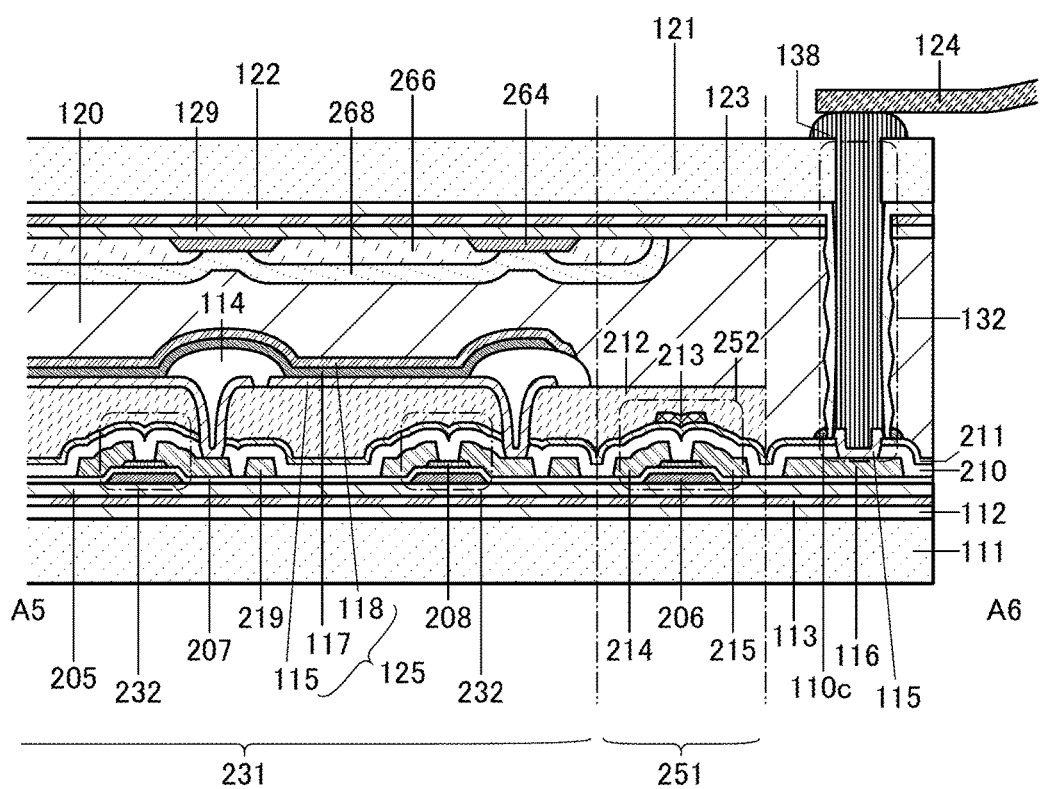

In this embodiment, a display device 200 having a structure different from the structure of the display device 100 described in the above embodiment will be described with reference to FIGS. 15A and 15B. FIG. 15A is a perspective view of the display device 200, and FIG. 15B is a cross-sectional view taken along the dashed-dotted line A5-A6 in FIG. 15A.

<Structure of Display Device 200>

The display device 200 described in this embodiment includes a display region 231 and a peripheral circuit 251. The display device 200 further includes an electrode 116 and a light-emitting element 125 including an electrode 115, an EL layer 117, and an electrode 118. A plurality of light-emitting elements 125 are formed in the display region 231. A transistor 232 for controlling the amount of light emitted from the light-emitting element 125 is connected to each light-emitting element 125.

The electrode 116 is electrically connected to an external electrode 124 through an anisotropic conductive connection layer 138 formed in an opening 132. Although not illustrated, the electrode 116 is electrically connected to the peripheral circuit 251.

The peripheral circuit 251 includes a plurality of transistors 252. The peripheral circuit 251 has a function of determining which of the light-emitting elements 125 in the display region 231 is supplied with a signal from the external electrode 124.

In the display device 200 illustrated in FIGS. 15A and 15B, a substrate 111 and a substrate 121 are attached to each other with a bonding layer 120 provided therebetween. An organic film 113 is formed over the substrate 111 with a bonding layer 112 provided therebetween. An insulating layer 205 is formed over the organic film 113. The insulating layer 205 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 can be formed by a sputtering method, a CVD method, a thermal oxidation method, a coating method, a printing method, or the like.

The insulating layer 205 functions as a base layer and can prevent or reduce diffusion of impurity elements from the substrate 111, the bonding layer 112, the organic film 113, or the like to the transistor or the light-emitting element.

The transistor 232 and the transistor 252 are formed over the insulating layer 205. Although a channel-etched transistor, which is a type of bottom-gate transistor, is illustrated as the transistor 232 and/or the transistor 252 in this embodiment, a channel-protective transistor, a top-gate transistor, or the like can also be used. Alternatively, an inverted staggered transistor or a forward staggered transistor can also be used. It is also possible to use a dual-gate transistor, in which a semiconductor layer where a channel is formed is provided between two gate electrodes. Furthermore, the transistor is not limited to a transistor having a single-gate structure; a multi-gate transistor having a plurality of channel formation regions, such as a double-gate transistor, may be used.

As the transistor 232 and the transistor 252, a transistor with any of a variety of structures such as a planar type, a FIN-type, and a Tri-Gate type can be used.

The transistor 232 and the transistor 252 may have the same structure or different structures. The size (e.g., channel length, channel width, or the like) of each transistor can be adjusted as appropriate.

The transistor 232 and the transistor 252 each include an electrode 206 that can function as a gate electrode, an insulating layer 207 that can function as a gate insulating layer, a semiconductor layer 208, an electrode 214 that can function as one of a source electrode and a drain electrode, and an electrode 215 that can function as the other of the source electrode and the drain electrode.

The electrode 116, a wiring 219, the electrode 214, and the electrode 215 are formed over the insulating layer 207. The wiring 219, the electrode 214, and the electrode 215 can be formed in the same process as the electrode 116 using part of the conductive layers for forming the electrode 116. The insulating layer 207 can be formed using a material and a method similar to those of the insulating layer 205.

The semiconductor layer 208 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used. In the case where an oxide semiconductor is used for the semiconductor layer 208, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

The term "CAAC-OS" refers to a crystal structure that has c-axis alignment, includes a plurality of nanocrystals connected in the a-b plane direction, and has distortion. Note that the distortion refers to a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in the a-b plane direction, the interatomic bond distance changed by substitution of a metal element, and the like.

The term "nc-OS" refers to a crystal structure in which a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed.

Note that an oxide semiconductor has an energy gap as wide as 2.0 eV or more and high visible-light transmissivity. In a transistor obtained by processing an oxide semiconductor under appropriate conditions, it is possible to realize an extremely low off-state current (current flowing between a source and a drain in an off state of a transistor). For example, the off-state current per 1 μm of a channel width can be less than or equal to 100 zA ($1 \times 10^{-19}$ A), less than or equal to 10 zA ($1 \times 10^{-20}$ A), and further less than or equal to 1 zA ($1 \times 10^{-21}$ A) when the source-drain voltage is 3.5 V at 25° C. Therefore, a display device with low power consumption can be achieved.

In the case where an oxide semiconductor is used for the semiconductor layer 208, an insulating layer containing oxygen is preferably used as an insulating layer in contact with the semiconductor layer 208. For the insulating layer in contact with the semiconductor layer 208, it is particularly preferable to use an insulating layer from which oxygen is released by heat treatment.

An insulating layer 210 is formed over the transistor 232 and the transistor 252, and an insulating layer 211 is formed over the insulating layer 210. The insulating layers 210 and 211 each function as a protective insulating layer and can prevent or reduce diffusion of impurity elements from a layer above the insulating layer 211 to the transistor 232 and the transistor 252. The insulating layers 210 and 211 each can be formed using a material and a method similar to those of the insulating layer 205.

An interlayer insulating layer 212 is formed over the insulating layer 211. The interlayer insulating layer 212 can absorb the unevenness caused by the transistor 232 and the transistor 252. Planarization treatment may be performed on a surface of the interlayer insulating layer 212. The planarization treatment may be, but not particularly limited to, polishing treatment (e.g., chemical mechanical polishing (CMP)) or dry etching treatment.

Forming the interlayer insulating layer 212 using an insulating material having a planarization function can omit polishing treatment. As the insulating material having a planarization function, for example, an organic material such as a polyimide resin or an acrylic resin can be used. Other than the above-described organic materials, it is also possible to use a low-dielectric constant material (low-k material) or the like. Note that the interlayer insulating layer 212 may be formed by stacking a plurality of insulating films formed of these materials.

Over the interlayer insulating layer 212, the light-emitting element 125 and a partition 114 for separating the adjacent light-emitting elements 125 are formed. The electrode 115 is also formed in the opening 132 so as to overlap with the electrode 116.

The substrate 121 is provided with a light-blocking layer 264, a coloring layer 266, and an overcoat layer 268. The display device 200 is what is called a top-emission light-emitting device, in which light emitted from the light-emitting element 125 is extracted from the substrate 121 side through the coloring layer 266.

The light-emitting element 125 is electrically connected to the transistor 232 through an opening formed in the interlayer insulating layer 212 and insulating layers 211 and 210.

With a micro optical resonator (also referred to as microcavity) structure which allows light emitted from the EL layer 117 to resonate, lights with different wavelengths and narrowed spectra can be extracted even when one EL layer 117 is used for different light-emitting elements 125.

Figure 16A:
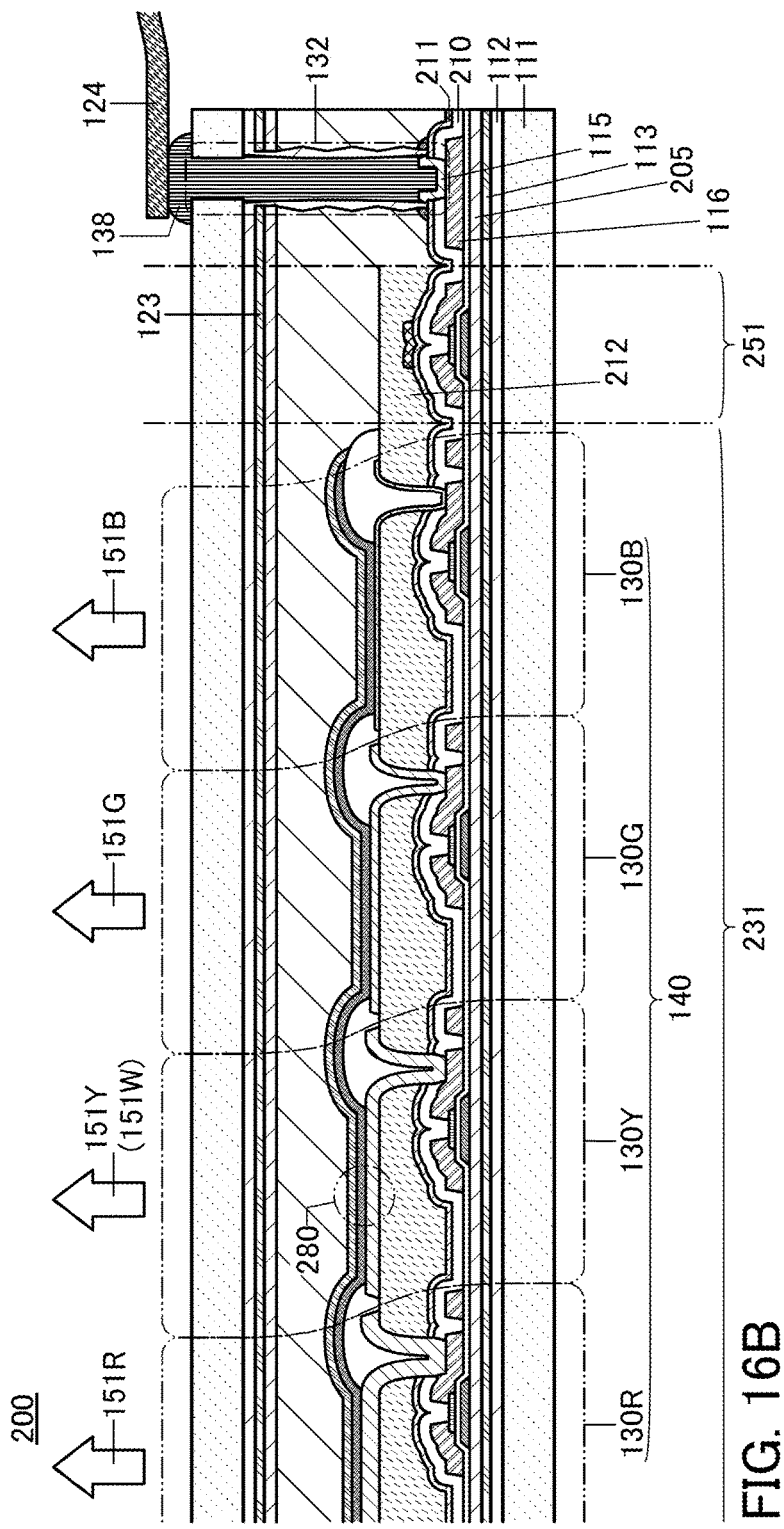
FIGS. 16A and 16B are cross-sectional views illustrating one embodiment of a display device.
Figure 16B:
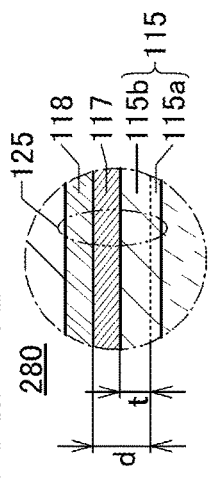

FIGS. 16A and 16B are cross-sectional views of the display device 200 in which the light-emitting element 125 has a microcavity structure, for example. Note that FIG. 16A corresponds to a cross-sectional view taken along the vicinity of the dashed-dotted line A5-A6 in FIG. 15A. FIG. 16B is an enlarged view of a portion 280 in FIG. 16A.

In the case where the light-emitting element 125 has a microcavity structure, the electrode 118 is formed using a conductive material (a semi-transmissive material) which transmits and reflects a certain amount of light of the incident light, and the electrode 115 is formed using a stack of a conductive material having high reflectance (the reflectance of visible light is 50% or more and 100% or less, or preferably 70% or more and 100% or less) and a conductive material having high transmittance (the transmittance of visible light is 50% or more and 100% or less, or preferably 70% or more and 100% or less). Here, the electrode 115 is formed of a stack of an electrode 115a formed using a conductive material that reflects light and an electrode 115b formed using a conductive material that transmits light. The electrode 115b is provided between the EL layer 117 and the electrode 115a (see FIG. 16B). The electrode 118 functions as a semi-transmissive electrode, and the electrode 115a functions as a reflective electrode.

For example, the electrode 118 may be formed using a conductive material containing silver (Ag) or a conductive material containing aluminum (Al) having a thickness of 1 nm to 30 nm, or preferably 1 nm to 15 nm. In this embodiment, as the electrode 118, a 10-nm-thick conductive material containing silver and magnesium is used.

The electrode 115a may be formed using a conductive material containing silver (Ag) or a conductive material containing aluminum (Al) having a thickness of 50 nm to 500 nm, or preferably 50 nm to 200 nm. In this embodiment, the electrode 115a is formed using a 100-nm-thick conductive material containing silver.

The electrode 115b may be formed using a conductive oxide containing indium (In) or a conductive oxide containing zinc (Zn) having a thickness of 1 nm to 200 nm, or preferably 5 nm to 100 nm. In this embodiment, indium tin oxide is used for the electrode 115b. Furthermore, a conductive oxide may be provided under the electrode 115a.

By changing the thickness t of the electrode 115b, a distance d from the interface between the electrode 118 and the EL layer 117 to the interface between the electrode 115a and the electrode 115b can be set to an arbitral value. The light-emitting elements 125 having different emission spectra for different pixels can be provided, even when one EL layer 117 is used, by changing the thickness t of the electrode 115b in each pixel. Thus, color purity of each emission color is improved and a display device having favorable color reproducibility can be achieved. It is not necessary to independently form the EL layer 117 in each pixel depending on the emission color; therefore, the number of manufacturing steps of the display device can be reduced and thus the productivity can be improved. Furthermore, a high-definition display device can be achieved easily.

Note that a method for adjusting the optical distance d is not limited to the above method. For example, the optical distance d may be adjusted by changing the thickness of the EL layer 117.

FIG. 16A shows an example in which a pixel 130R, a pixel 130G, a pixel 130B, and a pixel 130Y that emit red light 151R, green light 151G, blue light 151B, and yellow light 151Y, respectively, are used as one pixel 140. Note that one embodiment of the present invention is not limited to this example. As the pixel 140, subpixels that emit lights of red, green, blue, yellow, cyan, magenta, and white may be combined as appropriate. For example, the pixel 140 may be made up of the following three subpixels: the pixel 130R, the pixel 130G, and the pixel 130B.

Figure 17:
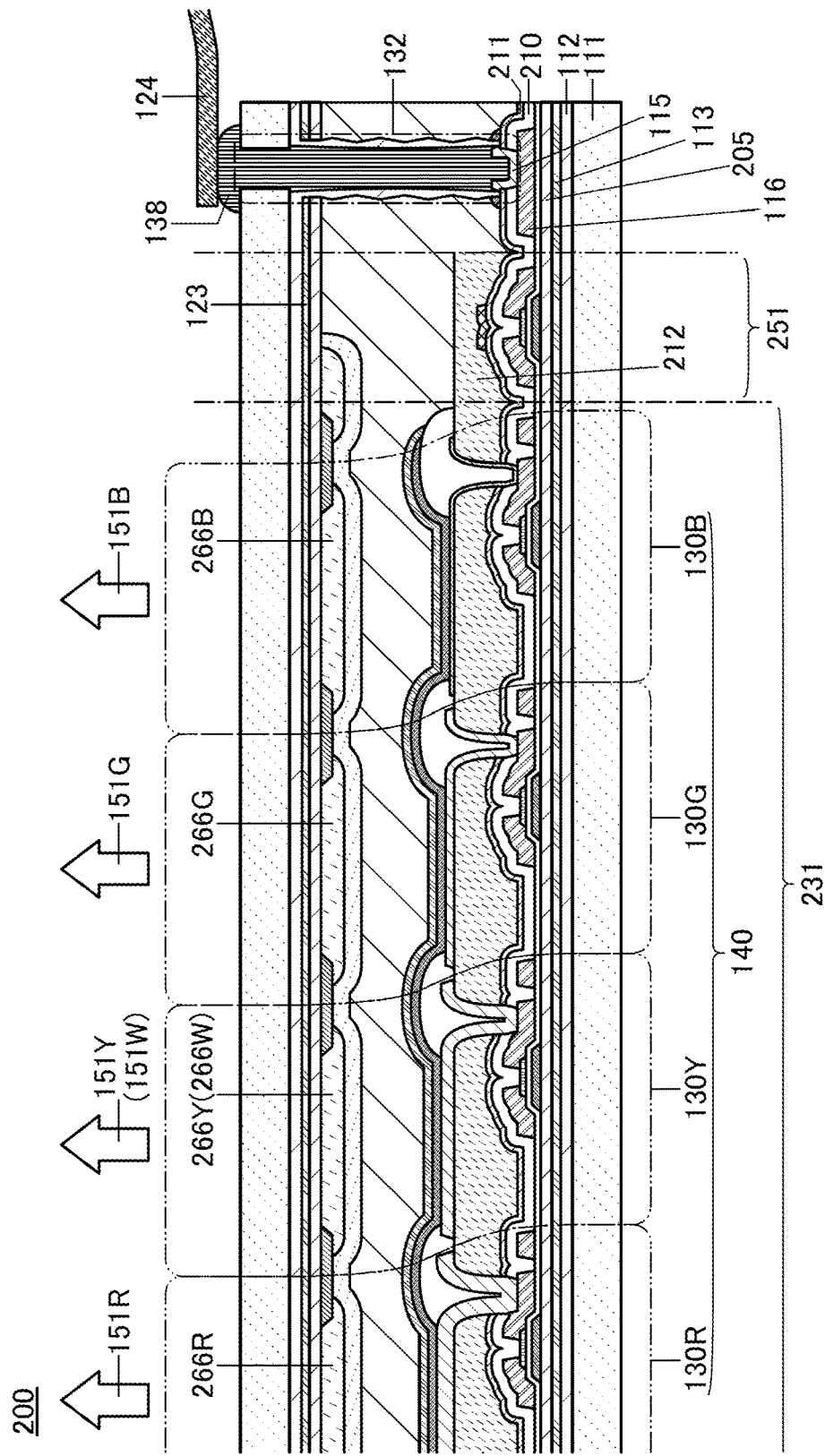
FIG. 17 is a cross-sectional view illustrating one embodiment of a display device.

The coloring layer 266 may be provided in a position overlapping with the light-emitting element 125 so that the light 151 is emitted outside through the coloring layer 266. FIG. 17 shows an example of a structure in which the coloring layer 266 is combined with the display device 200 illustrated in FIGS. 16A and 16B. In the display device 200 illustrated in FIG. 17, a coloring layer 266R, a coloring layer 266G, a coloring layer 266B, and a coloring layer 266Y that transmit light in a red wavelength band, light in a green wavelength band, light in a blue wavelength band, and light in a yellow wavelength band, respectively, are provided so as to overlap with the pixel 130R that emits the red light 151R, the pixel 130G that can emit the green light 151G, the pixel 130B that can emit the blue light 151B, and the pixel 130Y that can emit the yellow light 151Y, respectively.

By using the pixel 130Y in addition to the pixel 130R, the pixel 130G, and the pixel 130B, the color reproducibility of the display device can be increased. In the case where the pixel 140 is made up of only the pixel 130R, the pixel 130G, and the pixel 130B, all of the pixels 130R, 130G, and 130B need to emit light when white light is emitted from the pixel 140. When the pixel 130Y is provided in addition to the pixel 130R, the pixel 130G, and the pixel 130B, white light can be obtained by emitting light only from the pixel 130B and the pixel 130Y. Thus, since white light can be obtained even without light emission from the pixel 130R and the pixel 130G, power consumption of the display device can be reduced.

Moreover, a pixel 130W that can emit white light 151W may be used instead of the pixel 130Y. The use of the pixel 130W instead of the pixel 130Y allows emission of white light by emitting light only from the pixel 130W; therefore, power consumption of the display device can be further reduced.

Note that in the case where the pixel 130W is used, it is not necessary to provide a coloring layer in the pixel 130W. Without a coloring layer, the luminance of the display region is improved and a display device having favorable visibility can be achieved. Moreover, power consumption of the display device can be further reduced.

The pixel 130W may be provided with a coloring layer 266W that transmits light of substantially whole of the visible light region, by which the color temperature of the white light 151W can be changed. Accordingly, a display device having a high display quality can be achieved.

The color purity of the light 151 can be further improved by using the light-emitting element 125 having a microcavity structure and the coloring layer 266 in combination. Therefore, the color reproducibility of the display device 200 can be improved. In addition, light that enters from the outside is mostly absorbed by the coloring layer 266; therefore, reflection of the light that enters from the outside on the display region 231 is suppressed and thus the visibility of the display device can be improved. Accordingly, a display device having a high display quality can be achieved.

Although an active matrix display device is described as an example of the display device in this embodiment, one embodiment of the present invention can also be applied to a passive matrix display device. Moreover, one embodiment of the present invention can also be applied to a display device having a bottom-emission structure or a dual-emission structure.

This embodiment can be implemented in an appropriate combination with any of the structures described in the other embodiments.

Embodiment 3

Figure 18A:
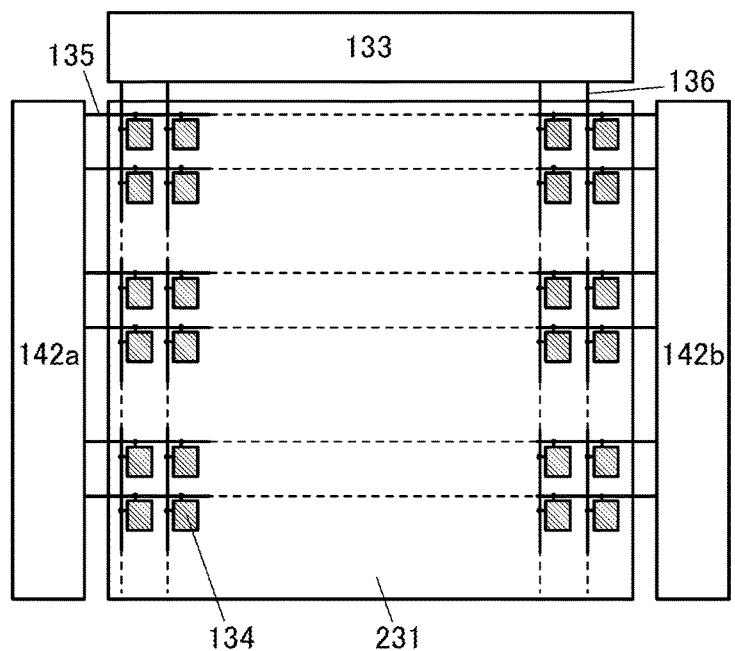
FIGS. 18A to 18C are a block diagram and circuit diagrams illustrating embodiments of a display device.

In this embodiment, a more specific structure example of the display device 200 will be described with reference to FIGS. 18A to 18C. FIG. 18A is a block diagram illustrating the structure example of the display device 200.

The display device 200 illustrated in FIG. 18A includes the display region 231, a driver circuit 142a, a driver circuit 142b, and a driver circuit 133. The driver circuits 142a, 142b, and 133 collectively correspond to the peripheral circuit 251 described in the above embodiment. The driver circuits 142a, 142b, and 133 are collectively referred to as a driver circuit portion in some cases.

The driver circuits 142a and 142b function as, for example, scan line driver circuits. The driver circuit 133 functions as, for example, a signal line driver circuit. Note that one of the driver circuits 142a and 142b may be omitted. Some sort of circuit facing the driver circuit 133 with the display region 231 provided therebetween may be provided.

The display device 200 includes m wirings 135 that are arranged substantially parallel to each other and whose potentials are controlled by the driver circuit 142a and/or the driver circuit 142b, and n wirings 136 that are arranged substantially parallel to each other and whose potentials are controlled by the driver circuit 133. The display region 231 includes a plurality of pixel circuits 134 arranged in matrix. One pixel circuit 134 is used for driving one subpixel (the pixel 130).

Each of the wirings 135 is electrically connected to the n pixel circuits 134 in a given row among the pixel circuits 134 arranged in m rows and n columns in the display region 231. Each of the wirings 136 is electrically connected to the m pixel circuits 134 in a given column among the pixel circuits 134 arranged in m rows and n columns. Note that m and n are each an integer greater than or equal to 1.

[Example of Pixel Circuit for Display Device]

Figure 18B:
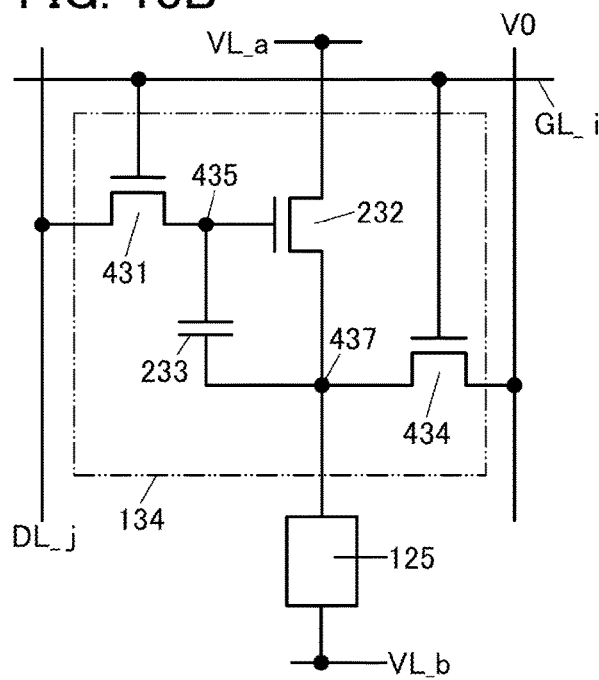
Figure 18C:
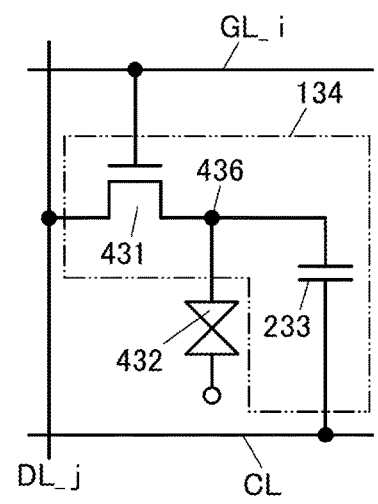

FIGS. 18B and 18C show examples of a circuit structure that can be used for the pixel circuits 134 in the display device in FIG. 18A.

The pixel circuit 134 illustrated in FIG. 18B includes a transistor 431, a capacitor 233, the transistor 232, and a transistor 434. The pixel circuit 134 is electrically connected to the light-emitting element 125.

One of a source and a drain of the transistor 431 is electrically connected to a wiring to which a data signal is supplied (hereinafter referred to as a signal line DL_j (j is an integer greater than or equal to 1 and less than or equal to n)). A gate of the transistor 431 is electrically connected to a wiring to which a gate signal is supplied (hereinafter referred to as a scan line GL_i is an integer greater than or equal to 1 and less than or equal to m)). The signal line DL_j and the scan line GL_i correspond to the wiring 136 and the wiring 135, respectively.

The transistor 431 has a function of controlling whether to write a data signal to a node 435.

One of a pair of electrodes of the capacitor 233 is electrically connected to the node 435, and the other of the pair of electrodes of the capacitor 233 is electrically connected to a node 437. The other of the source and the drain of the transistor 431 is electrically connected to the node 435.

The capacitor 233 has a function of a storage capacitor for storing data written to the node 435.

One of a source and a drain of the transistor 232 is electrically connected to a potential supply line VL_a, and the other of the source and the drain of the transistor 232 is electrically connected to the node 437. A gate of the transistor 232 is electrically connected to the node 435.

One of a source and a drain of the transistor 434 is electrically connected to a potential supply line V0, and the other of the source and the drain of the transistor 434 is electrically connected to the node 437. A gate of the transistor 434 is electrically connected to the scan line GL_i.

One of an anode and a cathode of the light-emitting element 125 is electrically connected to a potential supply line VL_b, and the other of the anode and the cathode of the light-emitting element 125 is electrically connected to the node 437.

As the light-emitting element 125, an organic electroluminescent element (also referred to as an organic EL element) can be used, for example. Note that the light-emitting element 125 is not limited thereto and may be an inorganic EL element containing an inorganic material, for example.

As a power supply potential, a potential on the comparatively high potential side or a potential on the comparatively low potential side can be used, for example. A power supply potential on the high potential side is referred to as a high power supply potential (also referred to as VDD), and a power supply potential on the low potential side is referred to as a low power supply potential (also referred to as VSS). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

A high power supply potential VDD is supplied to one of the potential supply line VL_a and the potential supply line VL_b, and a low power supply potential VSS is supplied to the other, for example.

In the display device including the pixel circuit 134 in FIG. 18B, the pixel circuits 134 are sequentially selected row by row by the driver circuit 142a and/or the driver circuit 142b, so that the transistors 431 and 434 are turned on and a data signal is written to the nodes 435.

When the transistors 431 and 434 are turned off, the pixel circuits 134 in which the data has been written to the nodes 435 are brought into a holding state. The amount of current flowing between the source electrode and the drain electrode of the transistor 232 is controlled in accordance with the potential of the data written to the node 435. The light-emitting element 125 emits light with luminance corresponding to the amount of the flowing current. This operation is sequentially performed row by row; thus, an image can be displayed.

[Example of Pixel Circuit for Liquid Crystal Display Device]

The pixel circuit 134 in FIG. 18C includes the transistor 431 and the capacitor 233. The pixel circuit 134 is electrically connected to a liquid crystal element 432.

The potential of one of a pair of electrodes of the liquid crystal element 432 is set in accordance with the specifications of the pixel circuit 134 as appropriate. The alignment state of the liquid crystal element 432 depends on data written to a node 436. A common potential may be applied to one of the pair of electrodes of the liquid crystal element 432 included in each of the plurality of pixel circuits 134. The potential supplied to one of a pair of electrodes of the liquid crystal element 432 in the pixel circuit 134 in one row may be different from the potential supplied to one of a pair of electrodes of the liquid crystal element 432 in the pixel circuit 134 in another row.

Examples of a method for driving the display device including the liquid crystal element 432 include a TN mode, an STN mode, a VA mode, an axially symmetric aligned micro-cell (ASM) mode, an optically compensated birefringence (OCB) mode, a ferroelectric liquid crystal (FLC) mode, an antiferro electric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Note that one embodiment of the present invention is not limited thereto, and various liquid crystal elements and driving methods can be used.

The liquid crystal element 432 may be formed using a liquid crystal composition including liquid crystal exhibiting a blue phase and a chiral material. Since a liquid crystal exhibiting a blue phase has optical isotropy, a liquid crystal display device including such a liquid crystal needs no alignment process, which reduces viewing angle dependence of the liquid crystal display device. Furthermore, the liquid crystal device including such a liquid crystal has a short response time of 1 msec or less.

In the pixel circuit 134 in the i-th row and the j-th column, one of the source and the drain of the transistor 431 is electrically connected to the signal line DL_j, and the other of the source and the drain of the transistor 431 is electrically connected to the node 436. The gate of the transistor 431 is electrically connected to the scan line GL_i. The transistor 431 has a function of controlling whether to write a data signal to the node 436.

One of the pair of electrodes of the capacitor 233 is electrically connected to a wiring to which a specific potential is supplied (hereinafter referred to as a capacitor line CL), and the other of the pair of electrodes of the capacitor 233 is electrically connected to the node 436. The other of the pair of electrodes of the liquid crystal element 432 is electrically connected to the node 436. The potential of the capacitor line CL is set in accordance with the specifications of the pixel circuit 134 as appropriate. The capacitor 233 has a function of a storage capacitor for storing data written to the node 436.

For example, in the display device including the pixel circuit 134 in FIG. 18C, the pixel circuits 134 are sequentially selected row by row by the driver circuit 142a and/or the driver circuit 142b, so that the transistors 431 are turned on and a data signal is written to the nodes 436.

When the transistors 431 are turned off, the pixel circuits 134 in which the data signal has been written to the nodes 436 are brought into a holding state. This operation is sequentially performed row by row; thus, an image can be displayed on the display region 231.

[Display Element]

The display device of one embodiment of the present invention can employ various modes and can include various elements. The display element includes at least one of an electroluminescence (EL) element (e.g., an EL element including organic and inorganic materials, an organic EL element, or an inorganic EL element) including, an LED (e.g., a white LED, a red LED, a green LED, or a blue LED), a transistor (a transistor that emits light depending on current), a plasma display panel (PDP), an electron emitting element, a liquid crystal element, an electrophoretic element, a display element using micro electro mechanical systems (MEMS) such as a grating light valve (GLV), a digital micromirror device (DMD), a digital micro shutter (DMS) element, a MIRASOL (registered trademark) display, an interferometric modulator display (IMOD) element, and a piezoelectric ceramic display, an electrowetting element, and the like. Other than the above, the display device may contain a display medium whose contrast, luminance, reflectance, transmittance, or the like is changed by electrical or magnetic action. Alternatively, quantum dots may be used as the display element. Examples of display devices having EL elements include an EL display. Examples of a display device including an electron emitter include a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

This embodiment can be implemented in an appropriate combination with any of the structures described in the other embodiments.

Embodiment 4

In this embodiment, an example of a transistor that can be used in place of the transistor 232 and/or the transistor 252 described in the above embodiments will be described with reference to FIGS. 19A1, 19A2, 19B1, and 19B2. A transistor disclosed in this specification and the like can be used as the transistors 431, 434, and the like.

[Bottom-Gate Transistor]

A transistor 410 shown in FIG. 19A1 as an example is a channel-protective transistor that is a type of bottom-gate transistor. The transistor 410 is provided over a substrate 111 through the peeling process and the attachment process described in Embodiment 1. Specifically, an organic film 113 and the substrate 111 are attached to each other with a bonding layer 112 provided therebetween after the peeling process, whereby the transistor 410 is provided over the substrate 111. The substrate 111, the bonding layer 112, and the organic film 113 can be formed using materials similar to those used for the substrate 111, the bonding layer 112, and the organic film 113 described in Embodiment 1, respectively. The transistor 410 includes an insulating layer 209 that can function as a channel protective layer over a channel formation region in a semiconductor layer 208. The insulating layer 209 can be formed using a material and a method that are similar to those of the insulating layer 205 described in Embodiment 2. Part of an electrode 214 and part of an electrode 215 are formed over the insulating layer 209.

With the insulating layer 209 provided over the channel formation region, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

A transistor 411 illustrated in FIG. 19A2 is different from the transistor 410 in that an electrode 213 that can function as a back gate electrode is provided over an insulating layer 211. The electrode 213 can be formed using a material and a method that are similar to those of the electrode 206. The electrode 213 may be formed between an insulating layer 210 and the insulating layer 211.

In general, the back gate electrode is formed using a conductive layer and positioned so that the channel formation region of the semiconductor layer is provided between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode independently of the potential of the gate electrode, the threshold voltage of the transistor can be changed.

The electrodes 206 and 213 can each function as a gate electrode. Thus, the insulating layers 207, 209, 210, and 211 can each function as a gate insulating layer.

In the case where one of the electrode 206 and the electrode 213 is simply referred to as a "gate electrode", the other can be referred to as a "back gate electrode". For example, in the transistor 411, in the case where the electrode 213 is referred to as a "gate electrode", the electrode 206 may be referred to as a "back gate electrode". In the case where the electrode 213 is used as a "gate electrode", the transistor 411 can be regarded as a kind of top-gate transistor. Furthermore, one of the electrode 206 and the electrode 213 may be referred to as a "first gate electrode", and the other may be referred to as a "second gate electrode".

By providing the electrode 206 and the electrode 213 with the semiconductor layer 208 provided therebetween and setting the potentials of the electrode 206 and the electrode 213 to be the same, a region of the semiconductor layer 208 through which carriers flow is enlarged in the film thickness direction; thus, the number of transferred carriers is increased. As a result, the on-state current and the field-effect mobility of the transistor 411 are increased.

Therefore, the transistor 411 has large on-state current for the area occupied thereby. That is, the area occupied by the transistor 411 can be small for required on-state current.

The gate electrode and the back gate electrode are formed using conductive layers and thus each have a function of preventing an electric field generated outside the transistor from influencing the semiconductor layer in which the channel is formed (in particular, a function of blocking static electricity).

Since the electrode 206 and the electrode 213 each have a function of blocking an electric field generated outside, charges of charged particles and the like generated on the substrate 111 side or above the electrode 213 do not influence the channel formation region in the semiconductor layer 208. Therefore, degradation in a BT stress test (e.g., a negative gate bias temperature (−GBT) stress test in which negative charges are applied to a gate) can be reduced, and changes in the threshold voltage can be reduced. Note that this effect is caused when the electrodes 206 and 213 have the same potential or different potentials.

The BT stress test is one kind of accelerated test and can evaluate, in a short time, a change by long-term use (i.e., a change over time) in characteristics of transistors. In particular, the change in threshold voltage of the transistor between before and after the BT stress test is an important indicator when examining the reliability of the transistor. If the change in the threshold voltage between before and after the BT stress test is smaller, the transistor has higher reliability.

By providing the electrode 206 and the electrode 213 and setting the potentials of the electrode 206 and the electrode 213 to be the same, the change in threshold voltage is reduced. Accordingly, variation in electrical characteristics among a plurality of transistors is also reduced.

The transistor including the back gate electrode has a smaller change in threshold voltage between before and after a positive GBT stress test in which positive charges are applied to a gate than a transistor including no back gate electrode.

When the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

A transistor 420 shown in FIG. 19B1 as an example is a channel-protective transistor that is a type of bottom-gate transistor. The transistor 420 has substantially the same structure as the transistor 410 but is different from the transistor 410 in that the insulating layer 209 covers the side surfaces of the semiconductor layer 208.

The semiconductor layer 208 is electrically connected to the electrode 214 in an opening that is formed by selectively removing part of the insulating layer 209. The semiconductor layer 208 is electrically connected to the electrode 215 in an opening that is formed by selectively removing part of the insulating layer 209. A region of the insulating layer 209 that overlaps with the channel formation region can function as a channel protective layer.

A transistor 421 illustrated in FIG. 19B2 is different from the transistor 420 in that the electrode 213 that can function as a back gate electrode is provided over the insulating layer 211.

With the insulating layer 209, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

The distance between the electrode 214 and the electrode 206 and the distance between the electrode 215 and the electrode 206 in the transistors 420 and 421 are longer than those in the transistors 410 and 411. Thus, the parasitic capacitance generated between the electrode 214 and the electrode 206 can be reduced. The parasitic capacitance generated between the electrode 215 and the electrode 206 can also be reduced.

[Top-Gate Transistor]

A transistor 430 shown in FIG. 20A1 as an example is a type of top-gate transistor. The transistor 430 includes the semiconductor layer 208 over an insulating layer 119; the electrode 214 in contact with part of the semiconductor layer 208 and the electrode 215 in contact with part of the semiconductor layer 208, over the semiconductor layer 208 and the insulating layer 119; an insulating layer 207 over the semiconductor layer 208, the electrode 214 and the electrode 215; and the electrode 206 over the insulating layer 207. The insulating layer 210 and the insulating layer 211 are formed over the electrode 206.

Since, in the transistor 430, the electrode 206 overlaps with neither the electrode 214 nor the electrode 215, the parasitic capacitance generated between the electrode 206 and the electrode 214 and the parasitic capacitance generated between the electrode 206 and the electrode 215 can be reduced. After the formation of the electrode 206, an impurity element 221 is introduced into the semiconductor layer 208 using the electrode 206 as a mask, so that an impurity region can be formed in the semiconductor layer 208 in a self-aligned manner (see FIG. 20A3).

The introduction of the impurity element 221 can be performed with an ion implantation apparatus, an ion doping apparatus, or a plasma treatment apparatus.

As the impurity element 221, for example, at least one element of a Group 13 element and a Group 15 element can be used. In the case where an oxide semiconductor is used for the semiconductor layer 208, it is possible to use at least one kind of element of a rare gas, hydrogen, and nitrogen as the impurity element 221.

A transistor 431 illustrated in FIG. 20A2 is different from the transistor 430 in that the electrode 213 and an insulating layer 217 are included. The transistor 431 includes the electrode 213 formed over the insulating layer 119 and the insulating layer 217 formed over the electrode 213. As described above, the electrode 213 can function as a back gate electrode. Thus, the insulating layer 217 can function as a gate insulating layer. The insulating layer 217 can be formed using a material and a method that are similar to those of the insulating layer 205.

The transistor 431 as well as the transistor 411 has large on-state current for the area occupied thereby. That is, the area occupied by the transistor 431 can be small for required on-state current. According to one embodiment of the present invention, the area occupied by a transistor can be reduced. Therefore, according to one embodiment of the present invention, a semiconductor device having a high degree of integration can be provided.

Transistors 440 and 441 exemplified in FIGS. 20B1 and 20B2 are each a type of top-gate transistor. The transistors 440 and 441 are different from the transistors 430 and 431, respectively, in that the semiconductor layers 208 are formed after the formation of the electrodes 214 and the electrodes 215. Thus, in the transistors 440 and 441, part of the semiconductor layer 208 is formed over the electrode 214 and another part of the semiconductor layer 208 is formed over the electrode 215.

The transistor 441 as well as the transistor 411 has large on-state current for the area occupied thereby. That is, the area occupied by the transistor 441 can be small for required on-state current. Therefore, a semiconductor device having a high degree of integration can be provided.

In the transistors 440 and 441, after the formation of the electrode 206, the impurity element 221 is introduced into the semiconductor layer 208 using the electrode 206 as a mask, so that an impurity region can be formed in the semiconductor layer 208 in a self-aligned manner.

Although the variety of films such as the metal film, the semiconductor film, and the inorganic insulating film which are disclosed in this specification and the like can be formed by a sputtering method or a plasma chemical vapor deposition (CVD) method, such films may be formed by another method such as a thermal CVD method, for example. A metal organic chemical vapor deposition (MOCVD) method or an atomic layer deposition (ALD) method may be employed as an example of a thermal CVD method.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and they are reacted with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on a surface of the substrate to form a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust the film thickness and thus is suitable for manufacturing a minute FET.

The variety of films such as the metal film, the semiconductor film, and the inorganic insulating film which are described in the above embodiments can be formed by a thermal CVD method such as a MOCVD method or an ALD method. For example, in the case where an In—Ga—Zn—O film is formed, trimethylindium ($In(CH_3)_3$), trimethylgallium ($Ga(CH_3)_3$), and dimethylzinc ($Zn(CH_3)_2$) are used. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, in the case where a hafnium oxide film is formed by a deposition apparatus using an ALD method, two kinds of gases, i.e., ozone (O$_3$) as an oxidizer and a source gas which is obtained by vaporizing liquid containing a solvent and a hafnium precursor compound (a hafnium alkoxide or hafnium amide such as tetrakis (dimethylamide) hafnium (TDMAH, Hf[N(CH$_3$)$_2$]$_4$)) are used. Examples of another material include tetrakis(ethylmethylamide)hafnium.

For example, in the case where an aluminum oxide film is formed by a deposition apparatus using an ALD method, two kinds of gases, e.g., H$_2$O as an oxidizer and a source gas which is obtained by vaporizing a solvent and liquid containing an aluminum precursor compound (e.g., trimethylaluminum (TMA, Al(CH$_3$)$_3$)) are used. Examples of another material include tris (dimethylamide)aluminum, triisobutylaluminum, and aluminum tris (2,2,6,6-tetramethyl-3,5-heptanedionate).

For example, in the case where a silicon oxide film is formed by a deposition apparatus using an ALD method, hexachlorodisilane is adsorbed on a surface where a film is to be formed, and radicals of an oxidizing gas (e.g., O$_2$ or dinitrogen monoxide) are supplied to react with the adsorbate.

For example, in the case where a tungsten film is formed by a deposition apparatus using an ALD method, a WF$_6$ gas and a B$_2$H$_6$ gas are sequentially introduced a plurality of times to form an initial tungsten film, and then a WF$_6$ gas and an H$_2$ gas are sequentially introduced a plurality of times to form a tungsten film. Note that an SiH$_4$ gas may be used instead of a B$_2$H$_6$ gas.

In the case where an oxide semiconductor film, for example, an In—Ga—Zn—O film is formed by a deposition apparatus using an ALD method, an In(CH$_3$)$_3$ gas and an O$_3$ gas are sequentially introduced a plurality of times to form an In—O layer, a Ga(CH$_3$)$_3$ gas and an O$_3$ gas are sequentially introduced a plurality of times to form a GaO layer, and then a Zn(CH$_3$)$_2$ gas and an O$_3$ gas are sequentially introduced a plurality of times to form a ZnO layer. Note that the order of these layers is not limited to this example. A mixed oxide layer such as an In—Ga—O layer, an In—Zn—O layer, or a Ga—Zn—O layer may be formed by using these gases. Note that although an H$_2$O gas which is obtained by bubbling water with an inert gas such as Ar may be used instead of an O$_3$ gas, it is preferable to use an O$_3$ gas, which does not contain H. Furthermore, instead of an In (CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Alternatively, a Zn(CH$_3$)$_2$ gas may be used.

This embodiment can be implemented in an appropriate combination with any of the structures described in the other embodiments.

Embodiment 5

In this embodiment, structure examples of a light-emitting element that can be used as the light-emitting element 125 will be described. Note that an EL layer 320 described in this embodiment corresponds to the EL layer 117 described in the other embodiments.
<Structure of Light-Emitting Element>

Figure 21A:
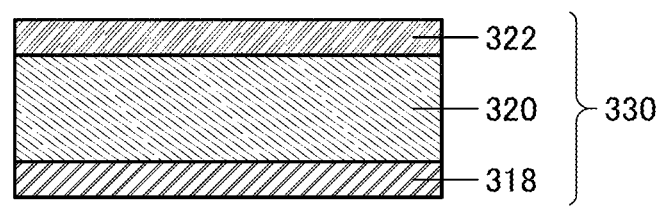
FIGS. 21A and 21B each illustrate a structure example of a light-emitting element.

In a light-emitting element 330 illustrated in FIG. 21A, an EL layer 320 is sandwiched between a pair of electrodes (electrodes 318 and 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, and an electron-injection layer can be used in an appropriate combination.

The light-emitting element 330 illustrated in FIG. 21A emits light when current flows by applying a potential difference between the electrode 318 and the electrode 322 and holes and electrons are recombined in the EL layer 320. In other words, a light-emitting region is formed in the EL layer 320.

In one embodiment of the present invention, light emitted from the light-emitting element 330 is emitted to the outside from the electrode 318 side or the electrode 322 side. Thus, at least one of the electrodes 318 and 322 is formed using a light-transmitting substance.

Figure 21B:
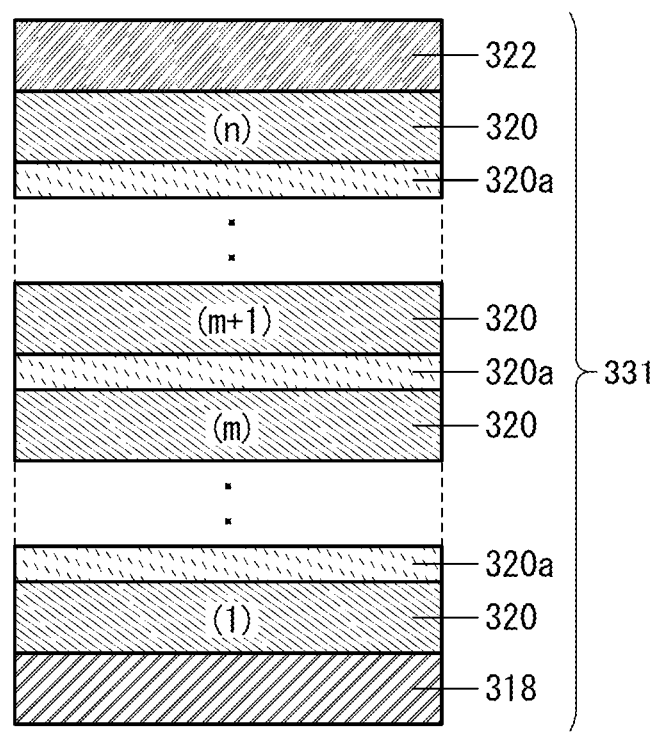

Note that a plurality of EL layers 320 may be stacked between the electrode 318 and the electrode 322 as in a light-emitting element 331 illustrated in FIG. 21B. In the case where n (n is a natural number greater than or equal to 2) layers are stacked, an electric charge generation layer 320a is preferably provided between an m-th EL layer 320 and an (m+1)th EL layer 320. Note that m is a natural number greater than or equal to 1 and less than n. The components other than the electrode 318 and the electrode 322 correspond to the EL layer 117 of the aforementioned Embodiments.

The electric charge generation layer 320a can be formed using a composite material of an organic compound and a metal oxide. Examples of the metal oxide are vanadium oxide, molybdenum oxide, tungsten oxide, or the like. As the organic compound, a variety of compounds can be used; for example, an aromatic amine compound, a carbazole derivative, an aromatic hydrocarbon, and an oligomer, a dendrimer, and a polymer having a basic skeleton of these compounds can be used. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the electric charge generation layer 320a have excellent carrier-injection properties and carrier-transport properties; thus, the light-emitting element 331 can be driven with low current and with low voltage. Other than the above composite material, a material obtained by adding an alkali metal, an alkaline earth metal, a compound of an alkali metal or a compound of an alkaline earth metal to the above composite material can be used in the electric charge generation layer 320a.

Note that the electric charge generation layer 320a may be formed by a combination of a composite material of an organic compound and a metal oxide with another material. For example, the electric charge generation layer 320a may be formed by a combination of a layer containing the composite material of an organic compound and a metal oxide with a layer containing one compound selected from electron-donating substances and a compound having a high electron-transport property. Furthermore, the electric charge generation layer 320a may be formed by a combination of a layer containing the composite material of an organic compound and a metal oxide with a transparent conductive film.

The light-emitting element 331 having such a structure is unlikely to result in energy transfer between the neighboring EL layer 320 and can easily realize high emission efficiency and a long lifetime. Furthermore, it is easy to obtain phosphorescence from one light-emitting layer and fluorescence from the other light-emitting layer.

The electric charge generation layer 320a has a function of injecting holes to one of the EL layers 320 that is in contact with the electric charge generation layer 320a and a function of injecting electrons to the other EL layer 320 that is in contact with the electric charge generation layer 320a, when voltage is applied to the electrodes 318 and 322.

The light-emitting element 331 illustrated in FIG. 21B can provide a variety of emission colors by changing the type of the light-emitting substance used for the EL layers 320. In addition, a plurality of light-emitting substances having different emission colors may be used as the light-emitting substances, so that light emission having a broad spectrum or white light emission can be obtained.

In the case of obtaining white light emission using the light-emitting element 331 in FIG. 21B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, the structure may include an EL layer emitting red light, an EL layer emitting green light, and an EL layer emitting blue light. Further alternatively, with a structure including EL layers emitting light of complementary colors, white light emission can be obtained. In a stacked-layer element including two EL layers which emit lights with complementary colors, the combinations of colors are as follows: blue and yellow, blue-green and red, and the like.

Note that in the structure of the above stacked-layer element, by providing the electric charge generation layer between the stacked light-emitting layers, the element can exhibit light emission with high luminance at a low current density, and have a long lifetime.

This embodiment can be implemented in an appropriate combination with any of the structures described in the other embodiments.

Embodiment 6

In this embodiment, a display module using the display device of one embodiment of the present invention will be described with reference to FIG. 22.

Figure 22:
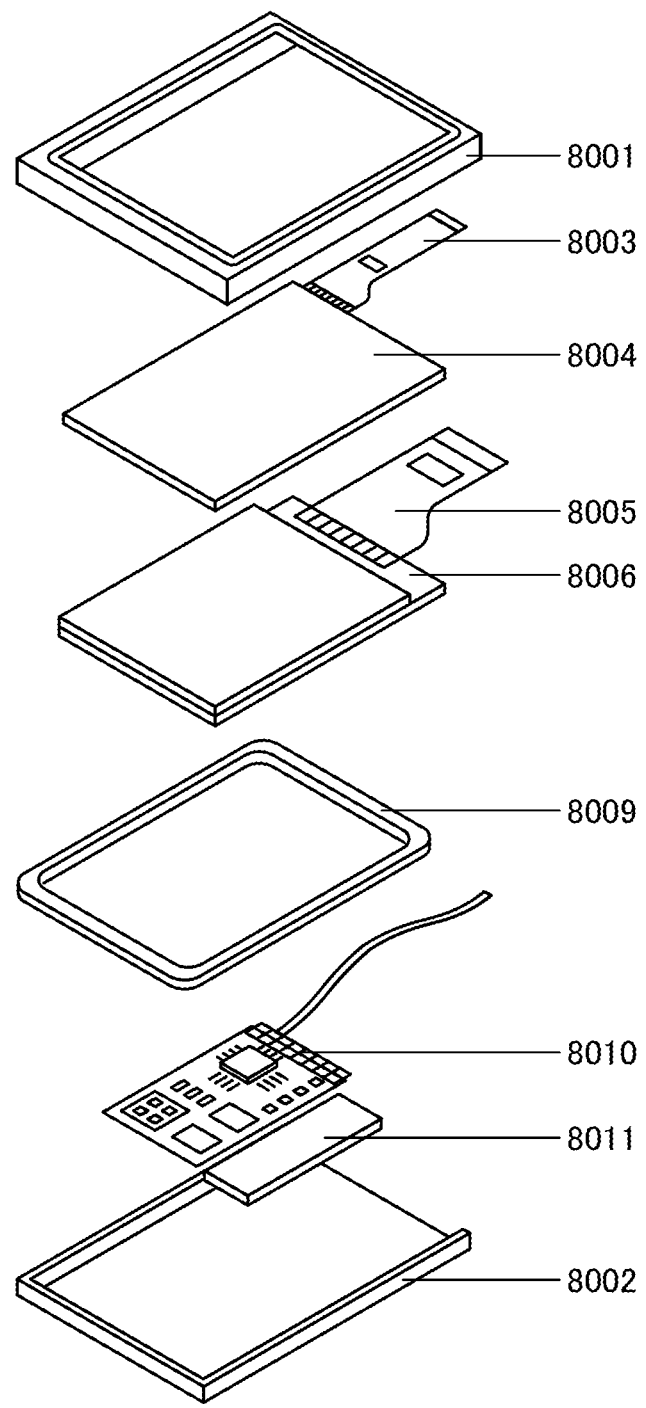
FIG. 22 illustrates a display module.

In a display module 8000 illustrated in FIG. 22, a touch sensor 8004 connected to an FPC 8003, a cell 8006 connected to an FPC 8005, a frame 8009, a printed board 8010, and a battery 8011 are provided between an upper cover 8001 and a lower cover 8002. At least one of the upper cover 8001, the lower cover 8002, the frame 8009, the printed board 8010, the battery 8011, the touch sensor 8004, and the like is not provided in some cases.

The display device of one embodiment of the present invention can be used for the cell 8006, for example.

The shapes and sizes of the upper cover 8001 and the lower cover 8002 can be changed as appropriate in accordance with the sizes of the touch sensor 8004 and the cell 8006.

The touch sensor 8004 can be a resistive touch sensor or a capacitive touch sensor and may be formed to overlap with the cell 8006. A counter substrate (sealing substrate) of the cell 8006 can have a touch sensor function. A photosensor may be provided in each pixel of the cell 8006 so that an optical touch sensor is obtained. An electrode for a touch sensor may be provided in each pixel of the cell 8006 so that a capacitive touch sensor is obtained.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external power source or a power source using the battery 8011 provided separately may be used. The battery 8011 can be omitted in the case of using an external power source.

The display module 8000 can be additionally provided with a member such as a polarizing plate, a retardation plate, or a prism sheet.

This embodiment can be implemented in an appropriate combination with any of the structures described in the other embodiments.

Embodiment 7

In this embodiment, examples of an electronic device and a lighting device including the display device of one embodiment of the present invention will be described with reference to drawings.

Specific examples of the electronic device that uses the display device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by electric motors using power from a power storage unit are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

In particular, as examples of electronic devices including a display device with flexibility, the following can be given: television devices (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 23A:
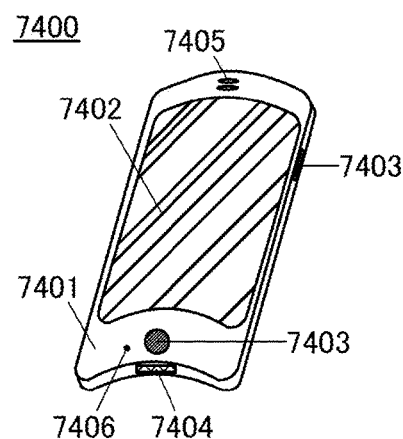
FIGS. 23A to 23E illustrate examples of electronic devices and lighting devices.

FIG. 23A is an example of a mobile phone. A mobile phone 7400 includes a display portion 7402 that is incorporated in a housing 7401. The mobile phone 7400 further includes operation buttons 7403, an external connection port 7404, a speaker 7405, a microphone 7406, and the like. The mobile phone 7400 is manufactured using the display device for the display portion 7402.

The mobile phone 7400 in FIG. 23A includes a touch sensor on the display portion 7402, and when the display portion 7402 is touched with a finger or the like, data can be input into the mobile phone 7400. Furthermore, operations such as making a call and inputting a letter can be performed by touch on the display portion 7402 with a finger or the like.

With the operation buttons 7403, power ON/OFF can be switched. In addition, types of images displayed on the display portion 7402 can be switched; for example, switching images from a mail creation screen to a main menu screen.

Here, the display portion 7402 includes the display device of one embodiment of the present invention. Thus, the mobile phone can have a curved display portion and high reliability.

Figure 23B:
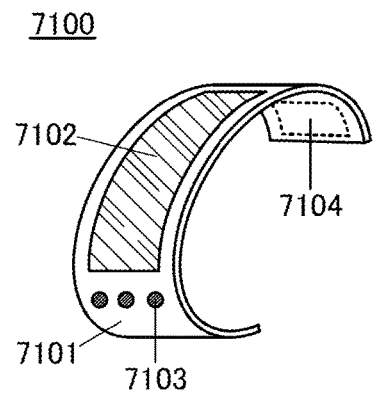

FIG. 23B is an example of a wristband-type display device. A portable display device 7100 includes a housing 7101, a display portion 7102, operation buttons 7103, and a transceiver 7104.

The portable display device 7100 can receive a video signal with the transceiver 7104 and can display the received video on the display portion 7102. In addition, with the transceiver 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the portable display device can have a curved display portion and high reliability.

Figure 23C:
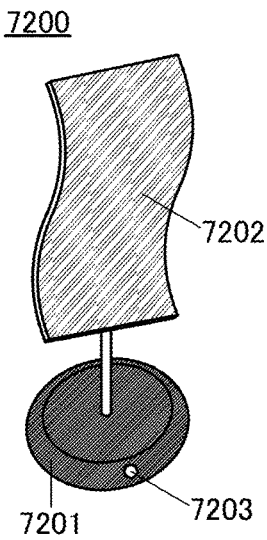
Figure 23D:
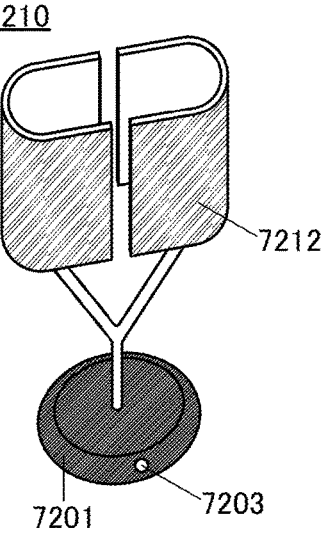
Figure 23E:
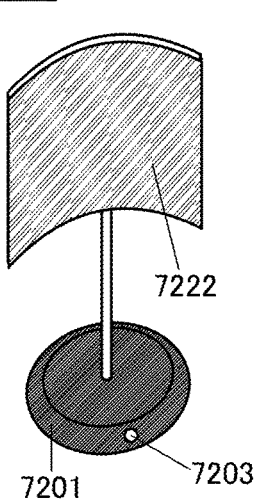

FIGS. 23C to 23E show examples of lighting devices. Lighting devices 7200, 7210, and 7220 each include a stage 7201 provided with an operation switch 7203 and a light-emitting portion supported by the stage 7201.

The lighting device 7200 illustrated in FIG. 23C includes a light-emitting portion 7202 with a wave-shaped light-emitting surface and thus is a good-design lighting device.

A light-emitting portion 7212 included in the lighting device 7210 illustrated in FIG. 23D has two convex-curved light-emitting portions symmetrically placed. Thus, light radiates from the lighting device 7210 in all directions.

The lighting device 7220 illustrated in FIG. 23E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion can be fixed on a plastic member, a movable frame, or the like so that an emission surface of the light-emitting portion can be curved freely depending on the intended use.

The light-emitting portions included in the lighting devices 7200, 7210, and 7220 each include the display device of one embodiment of the present invention. Thus, the light-emitting portions can be curved or bent into any shape and the lighting devices can have high reliability.

Figure 24A:
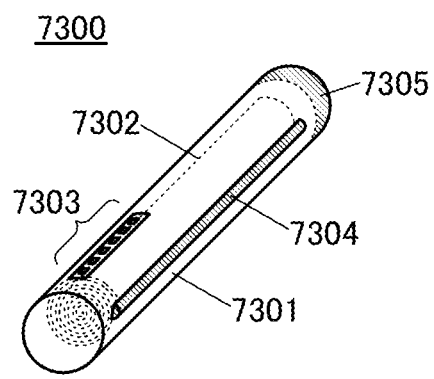
FIGS. 24A and 24B illustrate an example of an electronic device.

FIG. 24A shows an example of a portable display device. A display device 7300 includes a housing 7301, a display portion 7302, operation buttons 7303, a display portion pull 7304, and a control portion 7305.

The display device 7300 includes the rolled flexible display portion 7302 in the cylindrical housing 7301.

The display device 7300 can receive a video signal with the control portion 7305 and can display the received video on the display portion 7302. In addition, a power storage device is included in the control portion 7305. Moreover, a connector may be included in the control portion 7305 so that a video signal or power can be supplied directly.

With the operation buttons 7303, power ON/OFF, switching of displayed videos, and the like can be performed.

Figure 24B:
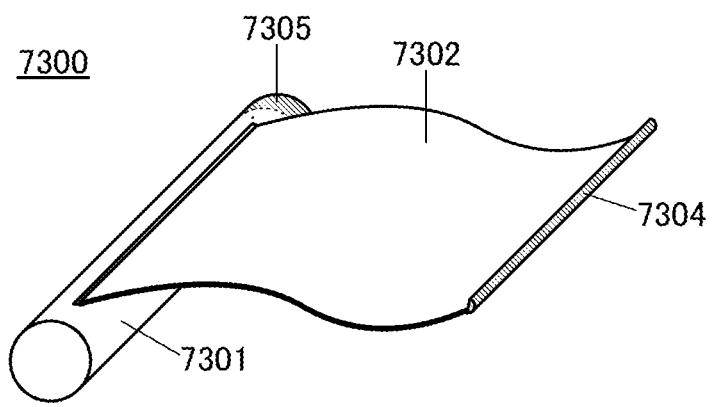

FIG. 24B illustrates a state where the display portion 7302 is pulled out with the display portion pull 7304. Videos can be displayed on the display portion 7302 in this state. Furthermore, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a display device that is flexible and highly reliable, which makes the display device 7300 lightweight and highly reliable.

Figure 25A:
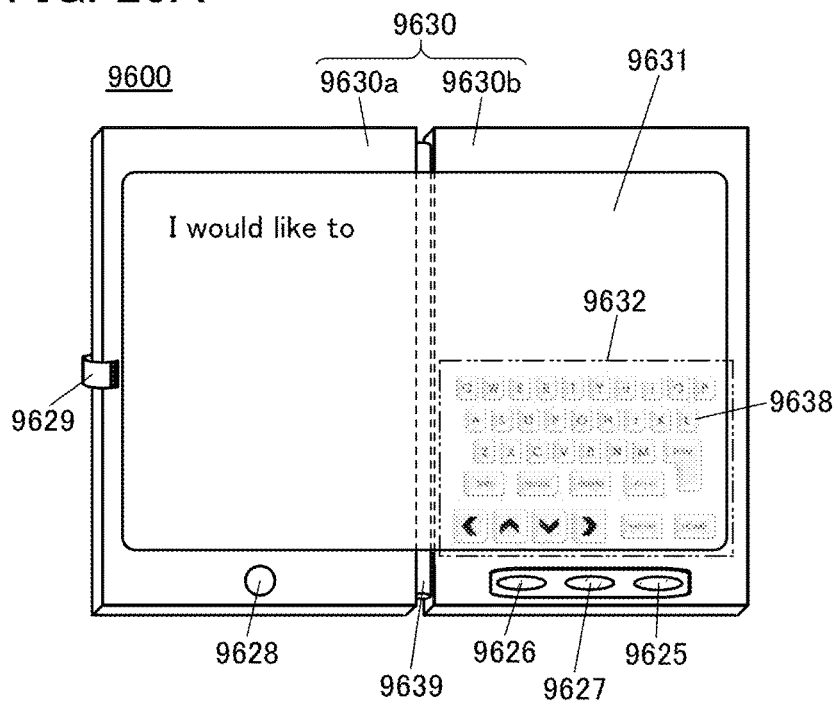
FIGS. 25A to 25C illustrate an example of an electronic device.
Figure 25B:
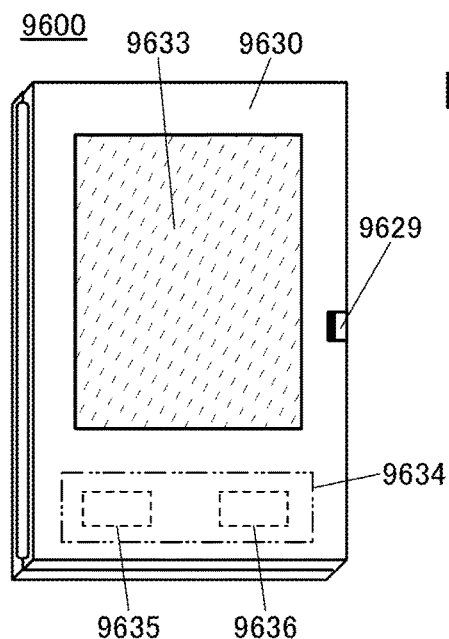

FIGS. 25A and 25B show a double foldable tablet terminal 9600 as an example. FIG. 25A illustrates the tablet terminal 9600 which is unfolded. The tablet terminal 9600 includes a housing 9630, a display portion 9631, a display mode switch 9626, a power switch 9627, a power-saving mode switch 9625, a clasp 9629, and an operation switch 9628.

The housing 9630 includes a housing 9630*a* and a housing 9630*b*, which are connected with a hinge portion 9639. The hinge portion 9639 makes the housing 9630 double foldable.

The display portion 9631 is provided on the housing 9630*a*, the housing 9630*b*, and the hinge portion 9639. By the use of the display device disclosed in this specification and the like for the display portion 9631, the tablet terminal in which the display portion 9631 is foldable and which has high reliability can be provided.

Part of the display portion 9631 can be a touchscreen region 9632 and data can be input when a displayed operation key 9638 is touched. A structure can be employed in which half of the display portion 9631 has only a display function and the other half has a touchscreen function, for example. The whole display portion 9631 may have a touchscreen function. For example, keyboard buttons may be displayed on the entire region of the display portion 9631 so that the display portion 9631 can be used as a data input terminal.

The display mode switch 9626 can switch the display between a portrait mode and a landscape mode, and between monochrome display and color display, for example. The power-saving mode switch 9625 can control display luminance in accordance with the amount of external light in use of the tablet terminal detected by an optical sensor incorporated in the tablet terminal. Another detection device including a sensor for detecting inclination, such as a gyroscope sensor or an acceleration sensor, may be incorporated in the tablet terminal, in addition to the optical sensor.

FIG. 25B illustrates the tablet terminal 9600 which is folded. The tablet terminal 9600 includes the housing 9630, a solar cell 9633, and a charge and discharge control circuit 9634. As an example, FIG. 25B illustrates the charge and discharge control circuit 9634 including a battery 9635 and a DC-to-DC converter 9636.

By including the display device that is disclosed in this specification and the like, the display portion 9631 is foldable. Since the tablet terminal 9600 is double foldable, the housing 9630 can be closed when the tablet terminal is not in use, for example; thus, the tablet terminal is highly portable. Moreover, since the display portion 9631 can be protected when the housing 9630 is closed, the tablet terminal can have high durability and high reliability for long-term use.

The tablet terminal illustrated in FIGS. 25A and 25B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touch sensor, the display portion, a video signal processing portion, or the like. Note that the solar cell 9633 is preferably provided on one or both surfaces of the housing 9630, in which case the battery 9635 can be charged efficiently. When a lithium ion battery is used as the battery 9635, there is an advantage of downsizing or the like.

Figure 25C:
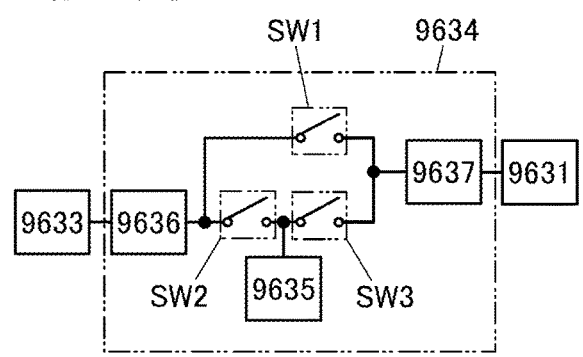

The structure and operation of the charge and discharge control circuit 9634 illustrated in FIG. 25B is described with reference to a block diagram of FIG. 25C. FIG. 25C illustrates the solar cell 9633, the battery 9635, the DC-to-DC converter 9636, a converter 9637, a switch SW1, a switch SW2, a switch SW3, and the display portion 9631. The battery 9635, the DC-to-DC converter 9636, the converter 9637, the switch SW1, the switch SW2, and the switch SW3 correspond to the charge and discharge control circuit 9634 illustrated in FIG. 25B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9637 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation unit, the power generation unit is not particularly limited, and the battery 9635 may be charged by another power generation unit such as a piezoelectric element or a thermoelectric conversion element (Peltier element). For example, the battery 9635 may be charged using a non-contact power transmission module that transmits and receives power wirelessly (without contact) or using another charge unit in combination.

This embodiment can be implemented in an appropriate combination with any of the structures described in the other embodiments.

(Notes on the Description in this Specification and the Like)

The following are notes on the structures in the above embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

<Notes on Ordinal Numbers>

In this specification and the like, ordinal numbers such as first, second, and third are used in order to avoid confusion among components. Thus, the terms do not limit the number or order of components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It is readily appreciated by those skilled in the art that modes and details can be changed in various ways without departing from the spirit and scope of the present invention. Thus, the present invention should not be interpreted as being limited to the description of the embodiments. Note that in the structures of the invention in the embodiments, the same portions or portions having similar functions are denoted by the same reference numerals in different drawings, and the description of such portions is not repeated.

In this specification and the like, the terms for explaining arrangement, such as "over" and "under," are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as perspective views, some of components might not be illustrated for clarity of the drawings.

In the drawings, the same components, components having similar functions, components formed of the same material, or components formed in the same process are denoted by the same reference numerals in some cases, and the description thereof is not repeated in some cases.

<Notes on Expressions that Can be Rephrased>

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. In this specification and the like, in the case where a transistor has two or more gates (this structure is referred to as a dual-gate structure in some cases), these gates are referred to as a first gate and a second gate or a front gate and a back gate in some cases. In particular, the term "front gate" can be replaced with a simple term "gate". The term "back gate" can be replaced with a simple term "gate". Note that a "bottom gate" is a terminal that is formed before a channel formation region in manufacture of a transistor, and a "top gate" is a terminal that is formed after a channel formation region in manufacture of a transistor.

A transistor has three terminals: a gate, a source, and a drain. A gate is a terminal that functions as a control terminal for controlling the conduction state of a transistor. Depending on the type of the transistor or levels of potentials applied to the terminals, one of a pair of input/output terminals functions as a source and the other functions as a drain. Therefore, the terms "source" and "drain" can be switched in this specification and the like. In this specification and the like, two terminals except a gate are sometimes referred to as a first terminal and a second terminal or as a third terminal and a fourth terminal.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

The following are definitions of the terms mentioned in the above embodiments.

<<Semiconductor>>

In this specification, a "semiconductor" may have characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor layer is silicon, examples of an impurity that changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow through the channel formation region.

Furthermore, functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode that can be moved mechanically, and operates by controlling conduction and non-conduction in accordance with movement of the electrode.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a wiring, an electrode, a terminal, a conductive film, a layer, or the like).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

This application is based on Japanese Patent Application serial no. 2016-097631 filed with Japan Patent Office on May 16, 2016, the entire contents of which are hereby incorporated by reference.

What is claimed is:

1. A method for manufacturing a display device, the method comprising steps of:
    forming a first layer over a first substrate, a terminal electrode over the first layer, a display element over the first layer, and a peeling layer overlapping with the terminal electrode;
    forming a second layer over a second substrate;
    attaching the first substrate to the second substrate using a bonding layer such that the first layer and the second layer face each other with the display element therebetween;
    separating the first substrate from the second substrate, wherein the separation occurs in the first layer;
    attaching a third substrate to the first layer;
    separating the second substrate from the third substrate, wherein the separation occurs in the second layer, a part of the bonding layer overlapping with the peeling layer, and the peeling layer;
    attaching a fourth substrate to the second layer; and
    forming an external electrode electrically connected to the terminal electrode,
    wherein the first layer comprises a first organic film, and
    wherein the second layer comprises a second organic film.

2. The method according to claim 1, wherein the separation of the first substrate or the second substrate is performed by laser light irradiation.

3. The method according to claim 1, wherein the external electrode is a flexible printed circuit.

4. The method according to claim 1, further comprising a step of forming a transistor over the first layer.

5. The method according to claim 1, wherein the first layer or the second layer comprises a photosensitive resin material.

6. The method according to claim 1, further comprising a step of forming a first insulating layer over the first layer and the terminal electrode,
    wherein the first insulating layer comprises a first opening, and
    wherein the peeling layer is over the first insulating layer and in the first opening.

7. The method according to claim 6,
    wherein the first layer comprises a second insulating layer over the first organic film, and
    wherein the second layer comprises a third insulating layer over the second organic film.

8. A method for manufacturing a display device, the method comprising steps of:
    forming a first layer over a first substrate, a terminal electrode over the first layer, a light-emitting element over the first layer, and a peeling layer overlapping with the terminal electrode;
    forming a second layer over a second substrate;
    attaching the first substrate to the second substrate using a bonding layer such that the first layer and the second layer face each other with the light-emitting element therebetween;
    separating the first substrate from the second substrate, wherein the separation occurs in the first layer;
    attaching a third substrate to the first layer;

separating the second substrate from the third substrate, wherein the separation occurs in the second layer, a part of the bonding layer overlapping with the peeling layer, and the peeling layer;

attaching a fourth substrate to the second layer; and forming an external electrode electrically connected to the terminal electrode, wherein the first layer comprises a first organic film, wherein the second layer comprises a second organic film, wherein the light-emitting element comprises a first electrode, an EL layer, and a second electrode, wherein the peeling layer comprises a first peeling layer and a second peeling layer, and wherein the EL layer and the first peeling layer are formed from a same material.

9. The method according to claim 8, wherein the second electrode and the second peeling layer are formed from a same material.

10. The method according to claim 8, wherein the separation of the first substrate or the second substrate is performed by laser light irradiation.

11. The method according to claim 8, wherein the external electrode is a flexible printed circuit.

12. The method according to claim 8, further comprising a step of forming a transistor over the first layer.

13. The method according to claim 8, wherein the first layer or the second layer comprises a photosensitive resin material.

14. The method according to claim 8, further comprising a step of forming a first insulating layer over the first layer and the terminal electrode, wherein the first insulating layer comprises a first opening, and wherein the first peeling layer and the second peeling layer are over the first insulating layer and in the first opening.

15. The method according to claim 14, wherein the first layer comprises a second insulating layer over the first organic film, and wherein the second layer comprises a third insulating layer over the second organic film.

16. A method for manufacturing a display device, the method comprising steps of:

forming a first layer over a first substrate, a terminal electrode over the first layer, and a first insulating layer over the terminal electrode and the first layer;

forming a first opening in the first insulating layer, the first opening overlapping with a part of the terminal electrode;

forming a display element over the first insulating layer, and a peeling layer over the first insulating layer and in the first opening;

forming a second layer over a second substrate;

forming a second opening in the second layer;

attaching the first substrate to the second substrate using a bonding layer such that the first layer and the second layer face each other with the display element therebetween and the first opening and the second opening overlap with each other;

peeling the first substrate off from the first layer;

attaching a third substrate to the first layer;

peeling the second substrate off from the second layer; and attaching a fourth substrate to the second layer, wherein, in the step of peeling the second substrate off from the second layer, a part of the bonding layer between the first opening and the second opening and a part of the peeling layer overlapping with the part of the bonding layer are peeled together with the second substrate so that the part of the terminal electrode is exposed, wherein the first layer comprises a first organic film, and wherein the second layer comprises a second organic film.

17. The method according to claim 16, wherein the peeling of the first substrate or the second substrate is performed by laser light irradiation.

18. The method according to claim 16, further comprising a step of forming a transistor over the first layer.

19. The method according to claim 16, wherein the first layer or the second layer comprises a photosensitive resin material.

20. The method according to claim 16, wherein the first layer comprises a second insulating layer over the first organic film, and wherein the second layer comprises a third insulating layer over the second organic film.

* * * * *